(12) United States Patent
Ingram

(10) Patent No.: US 9,608,155 B1
(45) Date of Patent: Mar. 28, 2017

(54) STRUCTURALLY INTEGRATED PARABOLIC TROUGH CONCENTRATOR WITH COMBINED PV AND THERMAL RECEIVER

(71) Applicant: John C Ingram, Poplarville, MS (US)

(72) Inventor: John C Ingram, Poplarville, MS (US)

(*) Notice: Subject to any disclaimer, the term of this patent is extended or adjusted under 35 U.S.C. 154(b) by 46 days.

(21) Appl. No.: 13/673,531

(22) Filed: Nov. 9, 2012

Related U.S. Application Data

(60) Provisional application No. 61/557,692, filed on Nov. 9, 2011.

(51) Int. Cl.
| | | |
|---|---|---|
| *H01L 31/054* | (2014.01) | |
| *H01L 31/052* | (2014.01) | |
| *H02S 40/44* | (2014.01) | |
| *F24J 2/12* | (2006.01) | |

(Continued)

(52) U.S. Cl.
CPC .......... *H01L 31/0547* (2014.12); *F24J 2/055* (2013.01); *F24J 2/12* (2013.01); *F24J 2/125* (2013.01); *H01L 31/0521* (2013.01); *H02S 40/44* (2014.12); *F24J 2002/1023* (2013.01); *Y02B 10/10* (2013.01); *Y02B 10/14* (2013.01); *Y02B 10/20* (2013.01); *Y02B 10/70* (2013.01);

(Continued)

(58) Field of Classification Search
CPC ......... Y02E 10/45; Y02E 10/52; Y02E 10/60; Y02B 10/10; Y02B 10/14; Y02B 10/20; Y02B 10/70; H01L 31/0522; H01L 31/0525; H01L 31/0547; F24J 2/12; F24J 2002/1023; F24J 2/125; F24J 2/14; F24J 2/145; F24J 2/461; F24J 2/055; H02S 40/44

USPC .......................... 136/243–265; 126/569–713
See application file for complete search history.

(56) References Cited

U.S. PATENT DOCUMENTS

| | | | | |
|---|---|---|---|---|
| 1,661,473 A | * | 3/1928 | Goddard | F24J 2/07 126/685 |
| 3,994,279 A | * | 11/1976 | Barak | 126/591 |
| 4,135,493 A | * | 1/1979 | Kennedy | 126/577 |

(Continued)

FOREIGN PATENT DOCUMENTS

| | | | | |
|---|---|---|---|---|
| WO | WO 2010096001 A1 | * | 8/2010 | |
| WO | WO 2012121712 A1 | * | 9/2012 | F24J 2/1057 |

*Primary Examiner* — James Lin
*Assistant Examiner* — Liesl C Baumann
(74) *Attorney, Agent, or Firm* — Sheppard, Mullin & Richter & Hampton LLP

(57) ABSTRACT

The invention includes a parabolic solar concentrator typified by a highly integrated structure whereby, mirror, aerodynamic elements, a shell structure, cooling elements and other elements have been integrated to form a unibody structure, which is both stiffer and lighter than traditional trough structures. The invention includes; aerodynamic features that greatly limit lift forces induced by high speed winds, a receiver with liquid cooling for better control of PV cell temperatures and which allows for the collection of the heat for beneficial use, accommodations for a solar tracker, and improvements in the focusing and distribution of light using secondary mirrors. The receiver incorporates specific details to improve heat transfer and reduce parasitic pumping loads and incorporates secondary mirrors to increase light acceptance angles. Automated mirror washing is addressed. In applications where the heat is un-utilized the integrated radiator is employed to dissipate the heat using both convection and radiation heat transfer.

16 Claims, 28 Drawing Sheets

(51) Int. Cl.
  *F24J 2/05* (2006.01)
  *F24J 2/10* (2006.01)

(52) U.S. Cl.
  CPC ............... *Y02E 10/45* (2013.01); *Y02E 10/52* (2013.01); *Y02E 10/60* (2013.01)

(56) References Cited

U.S. PATENT DOCUMENTS

| | | | | |
|---|---|---|---|---|
| 4,168,696 | A * | 9/1979 | Kelly | 126/683 |
| 4,178,913 | A | 12/1979 | Hutchison | |
| 4,306,540 | A | 12/1981 | Hutchison | |
| 4,479,485 | A * | 10/1984 | McDougal | F24J 2/07 126/648 |
| 5,374,317 | A * | 12/1994 | Lamb | F24J 2/10 126/685 |
| 5,404,723 | A | 4/1995 | Parker et al. | |
| 6,415,783 | B1 * | 7/2002 | Harrison | F24J 2/06 126/680 |
| 2004/0055593 | A1 * | 3/2004 | Besier | F24J 2/055 126/685 |
| 2009/0027792 | A1 * | 1/2009 | Dreyer et al. | 359/883 |
| 2010/0006087 | A1 * | 1/2010 | Gilon et al. | 126/572 |
| 2010/0043779 | A1 * | 2/2010 | Ingram | 126/694 |
| 2010/0205963 | A1 * | 8/2010 | Ammar | 60/641.15 |
| 2010/0319684 | A1 * | 12/2010 | Almogy et al. | 126/714 |
| 2011/0036345 | A1 * | 2/2011 | Almogy et al. | 126/714 |
| 2011/0073104 | A1 * | 3/2011 | Dopp et al. | 126/651 |
| 2011/0162637 | A1 * | 7/2011 | Hahn | F24J 2/07 126/600 |
| 2011/0174359 | A1 * | 7/2011 | Goei | F24J 2/07 136/246 |
| 2011/0259400 | A1 * | 10/2011 | Nilsson | 136/248 |
| 2012/0024346 | A1 * | 2/2012 | Bystrom et al. | 136/248 |
| 2013/0008487 | A1 * | 1/2013 | Cheng | F24J 2/067 136/248 |
| 2013/0306139 | A1 * | 11/2013 | Bostwick | H01L 31/058 136/248 |

* cited by examiner

STRUCTURALLY INTEGRATED PARABOLIC TROUGH CONCENTRATOR WITH COMBINED PV AND THERMAL RECEIVER

FIELD OF THE INVENTION

The present invention relates to parabolic trough solar concentrators and, more particularly, to a parabolic concentrator with improved PV cell cooling with plus means to collect heat energy for beneficial use, structurally integrated radiator, and integrating aerodynamic elements for controlling wind induced forces while also providing stiffness.

DESCRIPTION OF THE PROBLEM

The cost of parabolic concentrators and all solar power systems in general is one of the paramount problems of widespread adoption of solar energy. Many systems have solved the basic implementation problems associated with parabolic concentrators. However, these systems have in general used discrete components for each base requirement, i.e. mirror, structure, cooling, etc, as opposed to a highly integrated structure. In order to capitalize on the potential cost savings of concentrating light the structural weight of parabolic concentrators must be reduced while maintaining stiffness and performance, which may only be achieved by utilizing a highly integrated structure such as a unibody structure. Additionally there is a question of light utilization; once the sunlight is concentrated, CPV systems typically convert the light via PV cell and dissipate the remaining heat. The proportion of sunlight converted to heat is approximately four times the amount converted to electricity. Concentrated photovoltaic and thermal (CPVT) systems need to be developed that can capture the otherwise wasted heat for beneficial use, thus altering the economics of solar. Traditionally, concentrated photovoltaic (CPV) systems use passive cooling for the PV cells; this is material intensive, uncontrollable, and eliminates the possibility of collecting the heat for beneficial use. With passive cooling, cell temperatures may get too hot and in some cases exceed acceptable operating limits, which reduces the efficiency and shortens cell life. Parabolic trough concentrators have a linear focus; typically the PV array is disposed at or near the focal point or focal line. Mostly standard techniques have been employed to build the small linear arrays for parabolic trough concentrators. Standard array tabbing techniques do not allow for ultra close cell spacing, i.e. less then 1 mm. Thus, a significant portion of light may fall between the cells and be unavailable for conversion, i.e. lost.

Another problem can arise due to the aerodynamics of parabolic troughs. Parabolic trough solar concentrators are wing like in cross section and therefore can produce undesirable forces (i.e., lift and torque) in high speed wind conditions. These forces may damage the trough or associated structures they are mounted on/to (e.g., the roof). Washing of parabolic troughs is traditionally accomplished by spraying water from a passing vehicle; this is time consuming, costly and wasteful of water. Most parabolic troughs are shipped from the factory in some state of disassembly and require significant assembly in the field before installation, increasing installation labor cost.

BACKGROUND OF THE STATE OF THE ART

Cooling is critical to the success of concentrator systems that focus light onto photovoltaic cell(s), otherwise known as Concentrated Photovoltaic (CPV). Cell cooling in these systems may be either passive or active. Most CPV systems currently rely on passive cooling. While passive cooling has obvious advantages, such as simplicity and reliability, it has the significant disadvantages of being material intensive and therefore costly as well as uncontrollable, and less effective than a typical active cooling system. Passive cooling heat sinks are typically Aluminum with high surface area that is required for natural convection heat transfer; this mass of Aluminum is a significant cost component for CPV systems. Further cooling elements usually only add weight to a system but do not significant increase the structural strength, if at all. Such compact passive heat sinks with high surface area benefit very little from radiation heat transfer to the environment. In addition, because CPV systems use passive cooling to dissipate the heat from the PV cells to the atmosphere, there is little or no possibility of collecting the heat for beneficial uses. Such as can be done with emerging Concentrated Photovoltaic & Thermal (CPVT), essentially a subclass of CPV, whereby the Photovoltaic (PV) cell is actively cooled and heat is captured in a liquid heat transfer medium for beneficial use or to be dissipated elsewhere.

Typical parabolic trough concentrated PV system use a single reflection to focus light onto the PV cells. This has the advantage of not incurring losses from a second or successive reflection. However, it has the disadvantage that during the tracking of the sunlight either some light must be lost or the PV cell will have some dark areas, or a combination of both. Additionally, with the dispersion of the concentrated light due to solar ray angle, imperfect specular reflection, as well as various tolerances, limit the maximum concentration. To avoid this problem it is necessary to reflect at least a portion of the light a second time.

In flat panel PV modules spacing between the PV cells is not of critical importance, thusly spacing of several millimeters is acceptable. However, in CPV systems, where great care and cost have been expended to collect the light to a narrow linear focus, cell spacing is important. The traditional methods of tabbing solar cells to form the module into a string technically works, but with the cost of lost concentrated light and thereby efficiency. A fraction of a millimeter, the minimum to provide electrical isolation, is optimal for a parabolic trough CPV cell array.

In the state of the art parabolic troughs and other such linear concentrators for CPV, the PV cell buss bars are exposed to the concentrated light. This directly reduces the efficiency by the proportion of area covered by the buss bar since the light is reflected away from the cell and/or converted into heat. To reduce or eliminate this loss the buss bars should be removed or protected from the concentrated light. In concentrator cells, the proportion of buss bar coverage to active cell area can be high, even 20% or more. A typical technique for this has been to use rear surface contacts only. However, this is a costly and largely unnecessary approach for many applications.

In the state of the art parabolic concentrators for both CPV and concentrated thermal applications, little or no attention has been paid to controlling, reducing, and/or minimizing the resultant forces of lift and torque due to high speed winds, i.e. in excess of 90 mph. In high speed wind conditions, a parabola may have very high lift, several thousands of pounds force depending on the trough size. In conjunction with lift, they may also develop high torque, sufficient to damage the structure or break the constraints holding it from turning. If aerodynamically unmodified troughs are placed on rooftops, significant damage may occur to the structure do to high speed winds.

In all environments, mirrored surfaces of parabolic troughs require cleaning at various periodicities. This is usually accomplished by spraying the mirrors with water from a vehicle with a water tank and spray apparatus, which drives by the parabola.

This invention is warranted by the shortcomings of other parabolic trough concentrators. Specifically, the following areas are poorly or have entirely not been addressed: aerodynamic issues; material intensity, which contributes to high cost; concentrated light utilization, only converting a minor portion of concentrated light to electricity for beneficial use and then throwing away the heat as opposed to collecting it for beneficial use also; using passive cooling, those few systems which use active cooling use centralized heat exchangers as opposed to each trough having its own built in radiator which is much more efficient in terms of parasitic cooling loads and is more cost effective than centralized cooling.

OBJECTS OF THE INVENTION

It is an object of the invention to improve the aerodynamic performance of parabolic trough concentrators.

It is another object of the invention to provide a means of reducing and balancing the resultant aerodynamic forces due to high winds.

It is another object of the invention to provide aerodynamic flow spoilers along the longitudinal edges.

It is another object of the invention to integrate aerodynamic flow spoiler elements to increase stiffness of parabolic trough structures.

It is another object of the invention to provide an aerodynamic element disposed below the vertex of the parabola parallel to the longitudinal axis.

It is another object of the invention to have aerodynamic elements work together to control aerodynamic forces resulting from high speed winds.

It is another object of the invention to increase the stiffness of parabolic trough structures.

It is another object of the invention to reduce the mass per unit area of parabolic trough concentrators.

It is another object of the invention to improve the cooling of PV cells in CPV applications.

It is another object of the invention to provide a liquid cooled receiver design.

It is another object of the invention to provide a means of mixing the heat exchange liquid in the receiver fluid channels such that there is low pressure drop and low parasitic power consumption for pumping, It is another object of the invention to provide a means of providing increased heat transfer by continuously mixing the fluid flow, which disrupts the formation of a boundary layer.

It is another object of the invention to incorporate the radiator into the structure of the parabolic trough concentrator.

It is another object of the invention to improve the dissipation of heat, collected from cooling the PV cells, by a radiator which appreciably uses both convection and radiation heat transfer to the environment.

It is another object of the invention to improve the airflow through a radiator by using multiple tubes disposed periodically along the long axis of the back surface of the trough.

It is an object of the invention to in improve convection cooling by providing airflow passages disposed between the radiator and back shell components.

It is an object of the invention to provide vent holes to facilitate airflow in and/or out of the airflow passages.

It is another object of the invention to provide a means of distributing the heated liquid predominately evenly among the tubes of the radiator.

It is another object of the invention to provide a means of collecting heat, from heated PV cells, for beneficial use.

It is another object of the invention to provide a liquid cooled receiver design that can capture the heat from the PV cell for beneficial use or for removing the heat to the radiator.

It is another object of this invention to provide a means of replacing and/or upgrading the PV cells by exchanging the receiver or replacing the PV cells on the existing receiver.

It is another object of this invention to provide a means of changing and/or upgrading the receiver in the field.

It is another object of this invention to provide a means of manufacturing a receiver for CPV and/or CPVT applications.

It is another object of the invention to provide a means for supporting a receiver combined with a means for delivering heat exchange fluid to that receiver, in order to reduce light blockage and cost as well as to facilitate ease of installation.

It is another object of this invention to provide a means of connecting and securing a receiver to the supports.

It is another object of this invention to provide a pattern of concentration of light reflected from the main mirror to the receiver.

It is another object of this invention to provide a pattern of concentration of light reflected from the main mirror which exhibits a dual focal point for focusing onto a CPV receiver.

It is another object of this invention to provide secondary mirrors along both sided of the PV array as means for reflecting a portion of the solar rays a second time before they strike the surface of the PV cells or face of a thermal receiver.

It is another object of this invention to provide another secondary mirror displaced above the centerline of the PV array for reflecting an additional portion of the concentrated rays and redirecting them onto the face of the PV array or face of a thermal receiver.

It is another object of the invention to provide a PV cell layout, including buss bar location and sizing.

It is another object of the invention to provide means for evenly distributing the concentrated solar rays onto the face of the PV cells.

It is another object of the invention to provide alternative means for evenly distributing the concentrated solar rays onto the face of the PV cells.

It is another object of the invention to improve the utilization of concentrated solar rays by reducing blockage to the face of the solar cell, i.e. buss bar and thereby limiting losses.

It is another object of the invention to provide and aerodynamic shape to the receiver.

It is another object of the invention to provide a passage(s) in the receiver for wires, diodes etc.

It is another object of the invention to provide alternative means to electrically interconnecting solar cells in a string.

It is another object of the invention to provide decrease resistance in the electrically interconnect of solar cells, compared to state of the art tabbing.

It is another object of the invention to provide a means of close coupling (i.e. less than 1 mm) for solar PV cells in a string array.

It is another object of the invention to provide a convenient means of attaching diodes and/or wires to the cell electrical interconnect device.

It is another object of the invention to provide means for mounting solar tracking and alignment device in the receiver.

It is another object of the invention to increase the ease of and lower cost of maintenance by providing means for automated mirror washing.

It is another object of the invention to provide for easy and efficient shipping of the factory assembled parabolic trough concentrators; by allow the troughs to be packed in a nested fashion.

SUMMARY OF THE INVENTION

In accordance with the present invention, there is provided a parabolic trough solar concentrator typified by a highly integrated structure, whereby various, otherwise typically discrete, components are combined such that they work together to increase strength and performance while reducing weight.

This invention is a group of design features and elements intended to address the cost and performance of the state of the art parabolic trough. It is the general vision of the inventor that in order to be cost effective a solar energy concentrator system must reduce material intensity and improve performance. Therefore, a solar power module must be as materially efficient as possible. Concentrated PV offers the opportunity to use very small amounts of PV cells leaving open opportunity for entrepreneurs to design concentrator structures that minimize material structural weight and thereby cost. In order to reduce the weight and thereby the commodity cost of the materials required, the trough structure should be highly integrated to reduce cost and increase strength. By utilizing a highly integrated structure whereby various typically discrete components are combined such that they work together to form an integrated unibody structure, cost may be reduced and strength increased. For example, aerodynamic elements can be used to increase structural rigidity. Likewise, cooling elements, aka a radiator, can also be integrated into the structure to dissipate heat and increase stiffness, analogous to the concept of a unibody automobile. The aerodynamic features increase strength and reduce harmful and unwanted forces due to high wind speeds, thus making it stronger and reducing the required strength simultaneously.

Further, the present invention includes a liquid cooled receiver for active cooling for the PV cells. In conjunction with the liquid cooled receiver, each parabolic trough concentrator, for CPV applications, has its own radiator structurally integrated into the back side of the trough to dissipate the heat.

As an added bonus, locally dissipating the heat from cooling the PV cells reduces parasitic pumping losses as well as eliminating electric fans and a generally expensive central heat exchanger, and is an overall significant cost saving when implementing a parabolic trough CPV system.

Alternatively, as envisioned by this invention, the heat thus collected from the liquid cooled receiver can be collected for beneficial use. The cooling fluid once heated by passing through the receiver would be collected for use in water heating, building heating, driving an absorption chiller, or numerous other industrial processes. This is referred to as Concentrated PV and Thermal (CPTV).

As further explanation, the cooling elements, hereby called the radiator, should not merely function as cooling system, it should also function as a structural element, supplementing and/or replacing strength from other elements of the structure. When properly implemented, the radiator can offset its cost by reduce the cost of existing structure and by serving a dual role as both a cooling element and a structural component. This dual role, while not required by this patent, benefits to a great extent the economy of implementing solar power. In alternative configurations, the elements also do not need to be integrated into the unibody structure. This would still serve the purpose of controlling the aerodynamic forces but as a discrete add on component. In another alternative configuration, the radiator is not integrated into the unibody structure but is still distributed on the backside of the trough in order to dissipate the heat.

Another aspect of this invention is the secondary mirrors, called side mirrors and the apex mirror, incorporated into the receiver. They serve three important purposes: to redirect a portion of the concentrated light onto the solar cells, producing an even light distribution for the full range of motion between the trough and the direct solar rays; the side mirrors predominately hiding the bus bars of the solar cells from contact by concentrated light, thereby improving the utilization of the concentrated light by reducing losses; and the secondary mirrors allowing a greater degree of concentration by further focusing the already concentrated light.

Further elements of this invention include: a device for the close connection of solar cells to minimize the light lost in the gap between cells in an array; a means of mounting and aligning a solar tracking device; a means for automated washing of the mirror; trough design that permits efficient packing of the parabolic troughs for shipping; as well as techniques for manufacturing components; and other various complementary features.

BRIEF DESCRIPTION OF THE DRAWINGS

A complete understanding of the present invention may be obtained by reference to the accompanying drawings, when considered in conjunction with the subsequent, detailed description, in which.

For purposes of clarity and brevity, like elements and components will bear the same designations and numbering throughout the Figures.

DETAILED DESCRIPTION OF THE PREFERRED EMBODIMENT

Whereas it is desirable to use parabolic troughs for concentrated solar for CPV and CPVT applications to reduce cost and increase efficiency, in general as compared to non-concentrated. It is necessary to improve on the cost and performance of the state of the art parabolic trough concentrator for both thermal and CPV applications.

This invention provides for improvements in the structure of parabolic troughs and the integration of components to increase strength and performance while reducing weight. This invention also provides for improvements in the focusing of light and the distribution of concentrated light over the face of the PV cells. The improvements of the present invention may be applied to many configurations of basic trough designs such as the those proposed in: U.S. patent application Ser. No. 12/365,549 Solar Trough and Receiver; U.S. Pat. No. 4,135,493 Parabolic Trough Solar Energy Collector Assembly; or WIPO publication number WO 2007/076578 A1.

Realization of the potential to capitalize on PV cell cost savings requires integrating the trough and ancillary structures in to a unibody structure, which reduces mass while maintaining and/or improving other performance attributes.

Figure 1:
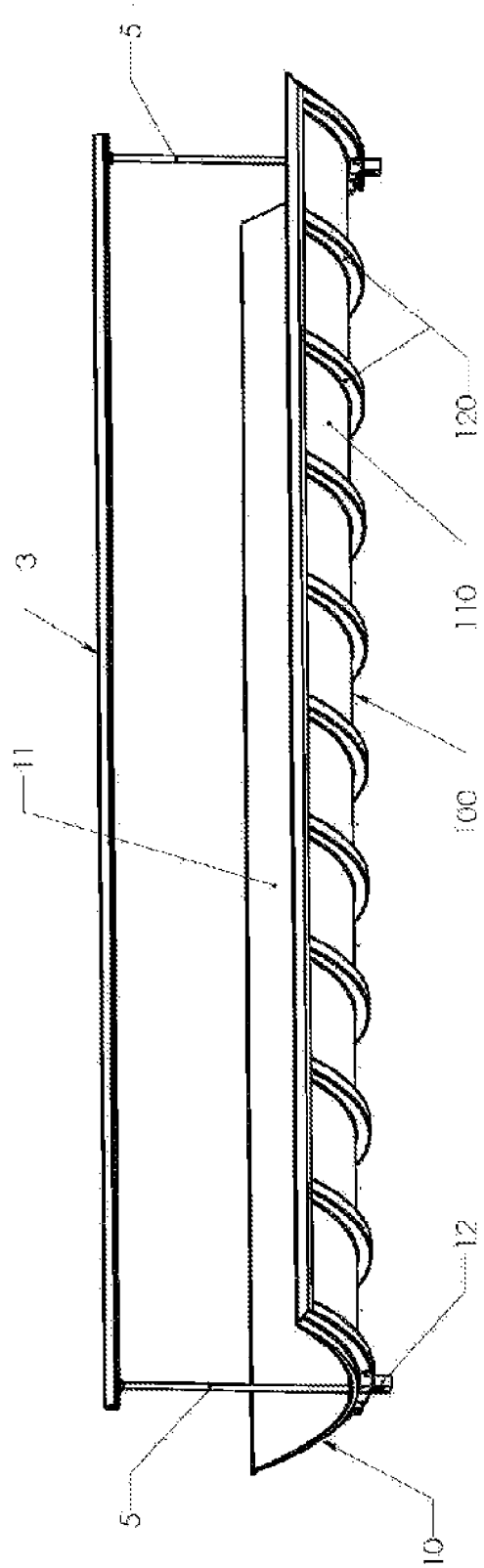
FIG. 1 is a perspective view of a basic parabolic trough concentrator 10 without improvements, primary trough components are: mirror 11; and generic receiver supports 5; generic receiver 3; mounting and pivot points 12; and back shell 100; which is composed of back shell ribs 120 connected by back shell sheet 110.

FIG. 1 shows a basic parabolic trough concentrator 10. The primary structure is composed of: back shell sheet 110 stretching between back shell ribs 120, which all together form a back shell 100; mounting and pivot block 12 at both ends; a mirror 11 (of glass, metal or other); general receiver support 5 at both ends of the trough; and a general receiver 3. This is a basic functional parabolic trough concentrator 10 showing only some of the elements of the present invention. Many parabolic troughs with an analogous structure have been proposed, a few examples are cited in the aforementioned patent references. An essential advantage of this invention is the integrated nature of those elements along with the addition of new elements and features to reduce cost and improve structural performance.

Figure 2:
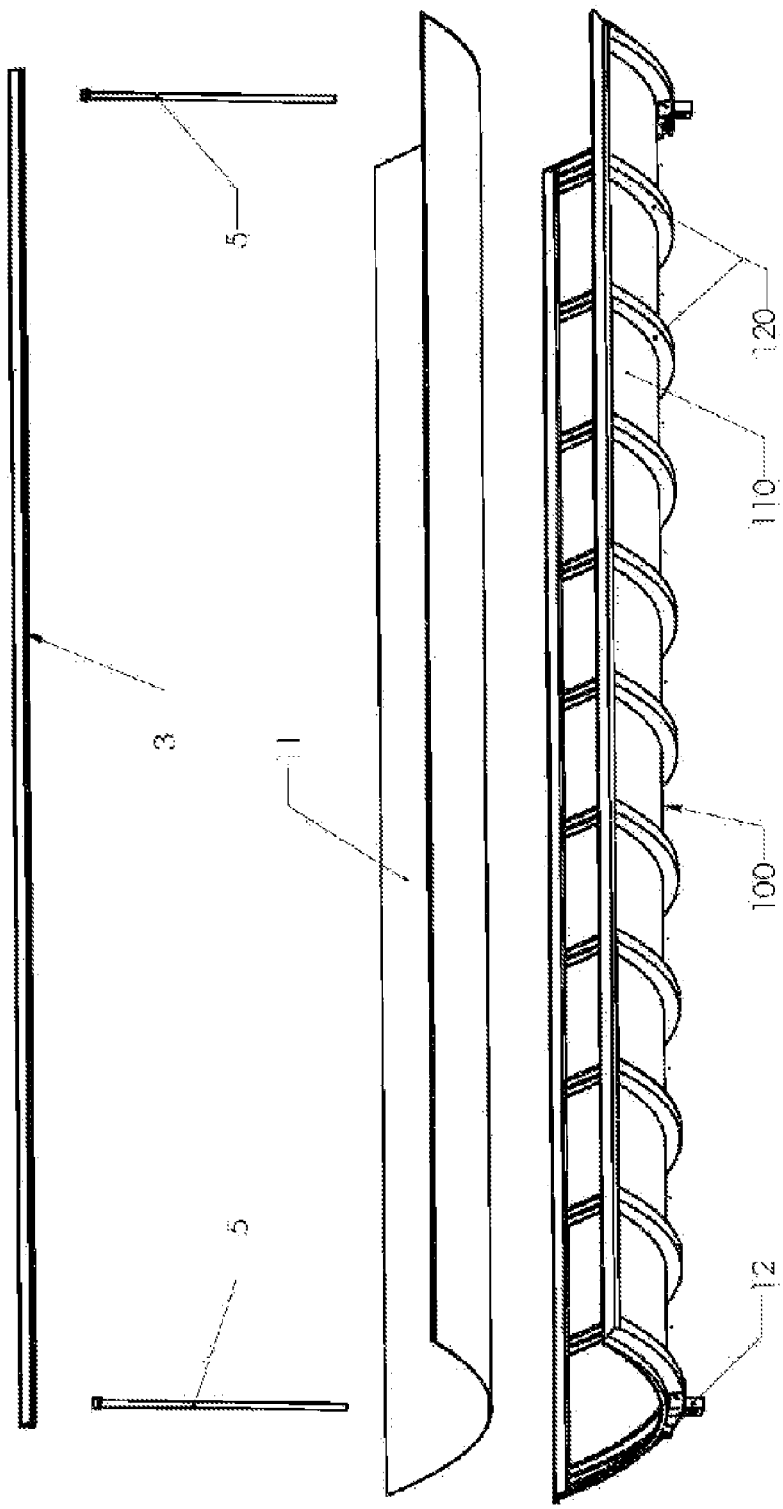
FIG. 2 is an exploded view of FIG. 1.

FIG. 2 is an exploded view of FIG. 1 showing some basic elements of a parabolic trough concentrator 10.

Figure 3:
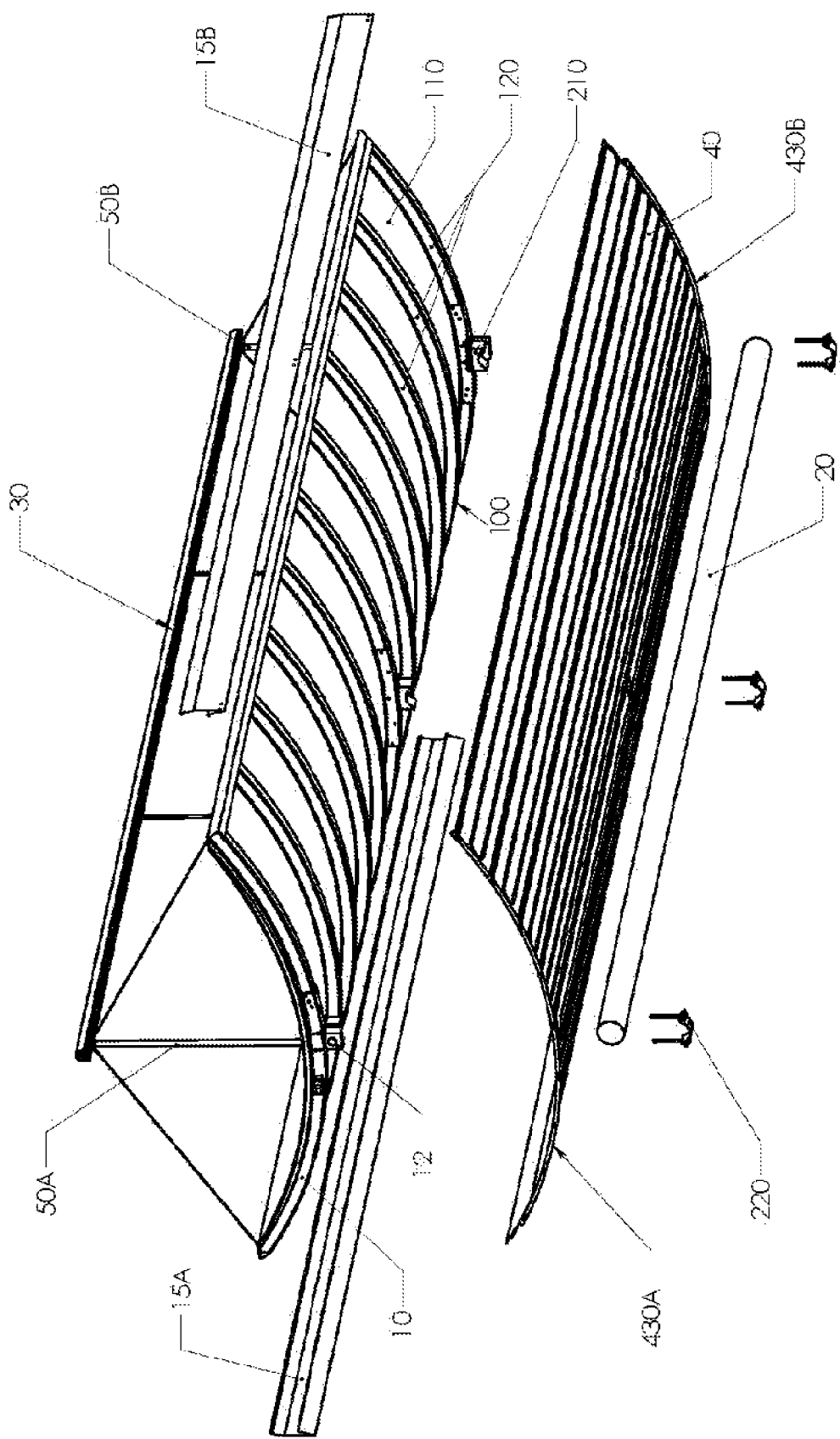
FIG. 3 is an exploded perspective view of some main elements of an improved parabolic trough to be added to basic trough 10. Radiator plenum 430 A&B at either end of the radiator 40, anti-lift aero balance tube 20, anti lift tube mount 210, anti lift tube bracket 220, 15 A&B are both aerodynamic spoiler and stiffener, mounting and pivot block 12, back shell sheet 110 and back shell ribs 120 form the primary structural elements of the back shell 100, generic receiver 3 and generic support 5 of FIG. 1 have been replace by elements of this invention 30 & 50 respectively, 30 an improved CPV receiver, 50 A&B are fluid riser and receiver supports located at opposite ends of the receiver.

FIG. 3 shows a basic parabolic trough concentrator 10 with the addition of some of the major elements of this invention visible in an exploded view. Elements of this invention shown, with the basic parabolic trough concentrator 10, include: combined aerodynamic spoiler and stiffener 15 A&B (A&B are identical); anti-lift aero balance tube 20, which is mounted to anti lift tube mount 210 at the ends and center minimally, then clamped in place with anti lift tube bracket 220 at each mount; the cooling elements (detailed later) which are collectively a radiator 40, with radiator plenum 430 A&B (A&B are identical), otherwise known as a header, at either end; integrated fluid riser and receiver support 50 A&B (A&B are identical); receiver central support 51 A&B (A&B are identical) are simple receiver supports space in the midsection of a receiver; receiver stabilizing wire 18 at each support; and CPV receiver 30 is a concentrated light receiver where the solar rays are intercepted for conversion alternatively a pure thermal receiver can be substituted without change to the trough structure.

Figure 4:
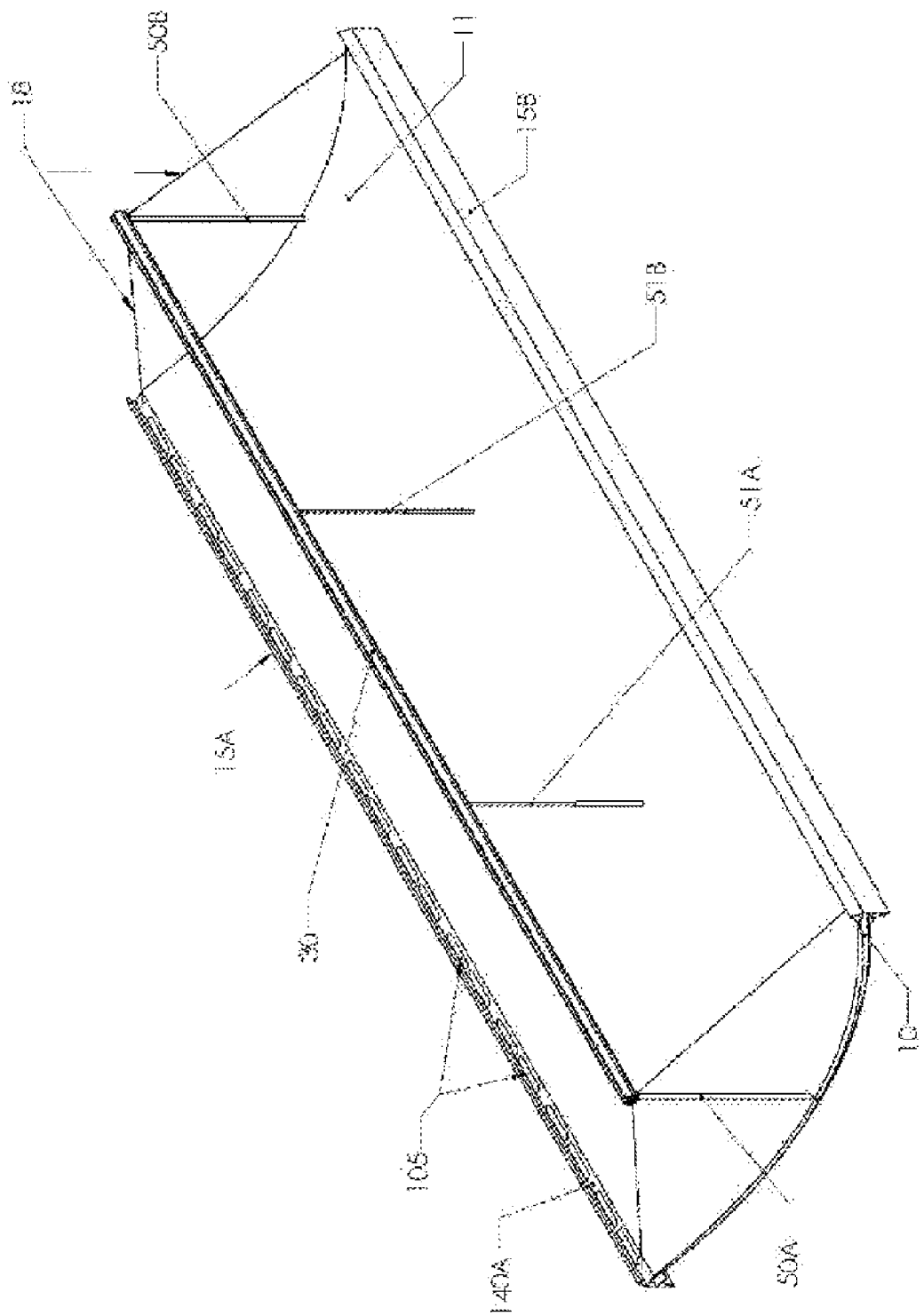
FIG. 4 is a top perspective view of an improved parabolic trough concentrator. 10 is the overall basic body of a parabolic trough, 11 is a mirror, 51 A&B are simple receiver supports space in the midsection of the receiver, 18 are stabilizer wires for the receiver, a multitude of vent holes 105 can be seen spaced along a side rail 140.

FIG. 4 shows an improved parabolic trough concentrator with some of the aforementioned improvements of this invention integrated. Additionally, each longitudinal edge has a side rail 140, which serves to strength and to cap back shell ribs 120 and back shell sheet 110. Side rails 140 A&B (A&B are identical) can be seen in FIG. 4 & FIG. 6. In CPV application where cooling is required side rail 140 also contains a multitude of vent holes 105.

There are two variants for the heat gathered from cooling the PV cells. Variant one: the heat is dissipated in the radiator on the backside of the trough. The coolant fluid is then circulated to the next trough in a continuous loop of cooling PV cells then dumping the heat in the radiator. Variant two: the heated fluid from cooling the PV cells is gathered via a piping system, for beneficial use elsewhere. Thus in variant two the radiator, if installed, is not utilized or is utilized to dump only excess heat that could not be used for beneficial purposes.

Figure 5:
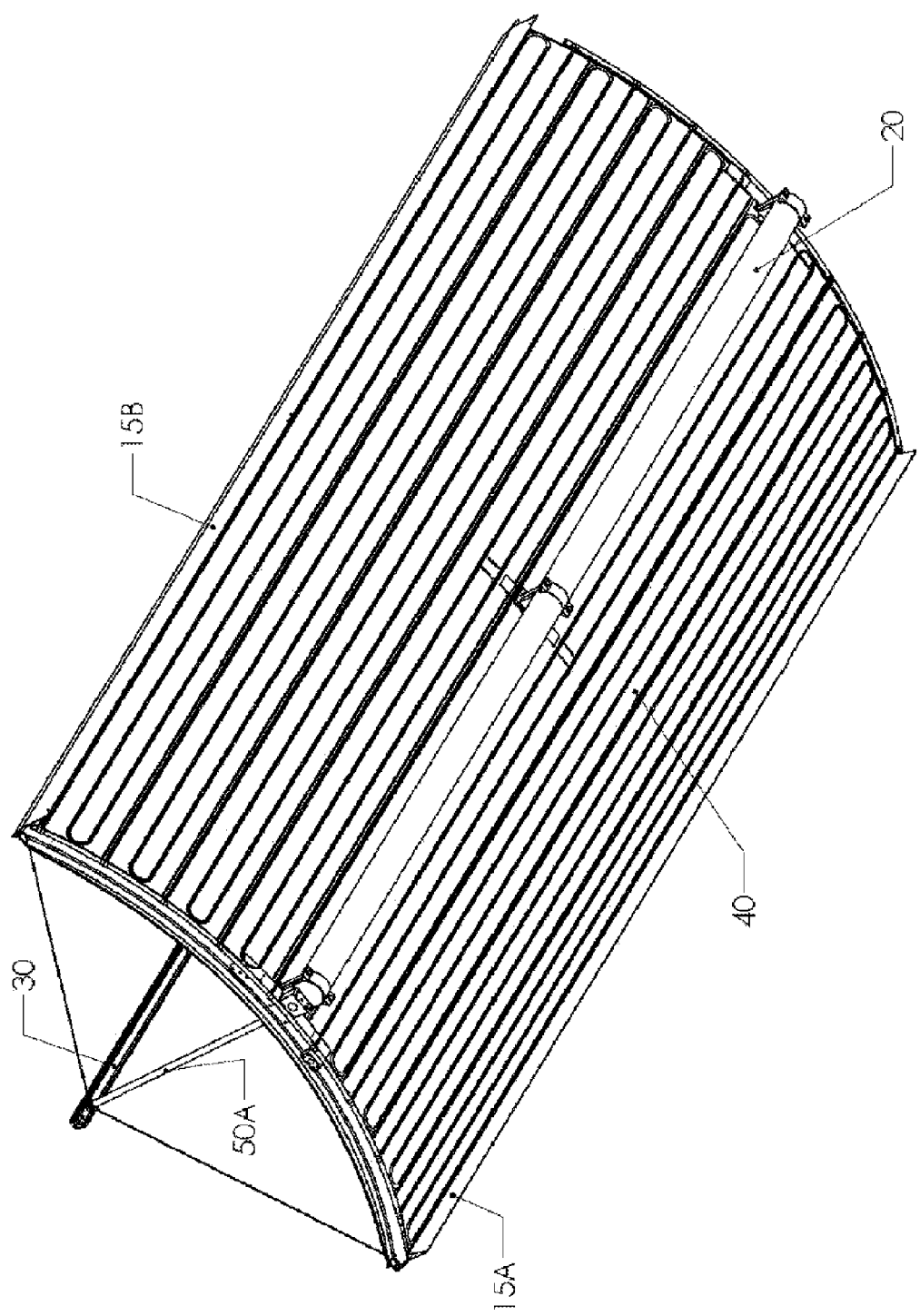
FIG. 5 is a bottom perspective view of an improved parabolic trough. This fully shows the coverage of radiator 40, and anti-lift aero balance tube 20.

FIG. 5 shows the back side of the improved parabolic trough concentrator, which reveals fully the coverage of radiator 40 and placement of anti-lift aero balance tube 20. Radiator 40 has been structurally integrating as one element of a "Unibody" structure, which adds strength to an integrated trough and reduces overall weight by being able to make other structural elements lighter. Radiator 40 is fixed to back shell ribs 120 on the backside of a back shell 100 by means of spot welding or other bonding technique.

Figure 8:
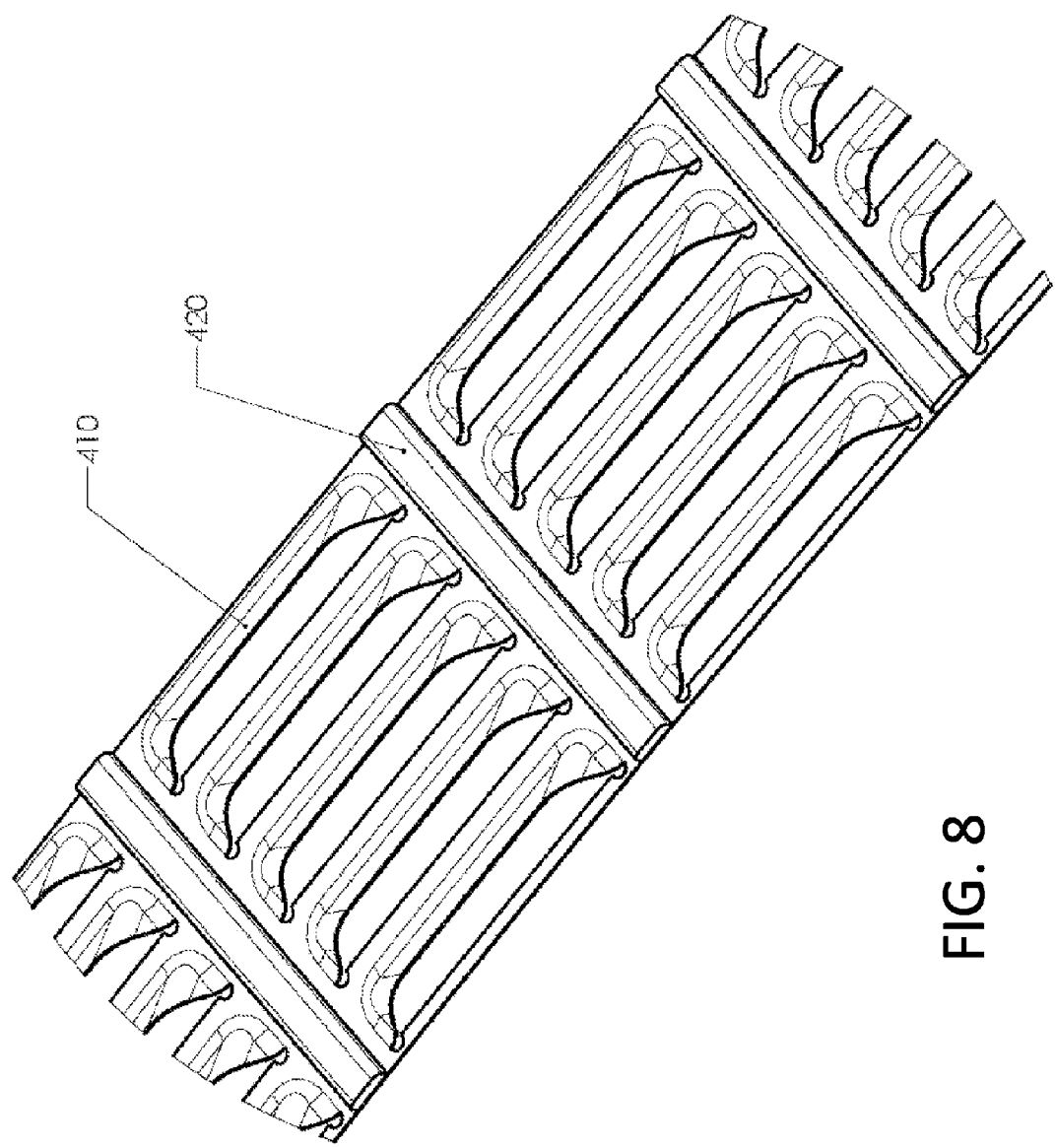
FIG. 8 is a close up perspective view of a section of the radiator 40, rows of louvers 410 and rows of parallel tubes 420 interspaced between louvers, which extend generally the length of the trough.
Figure 8A:
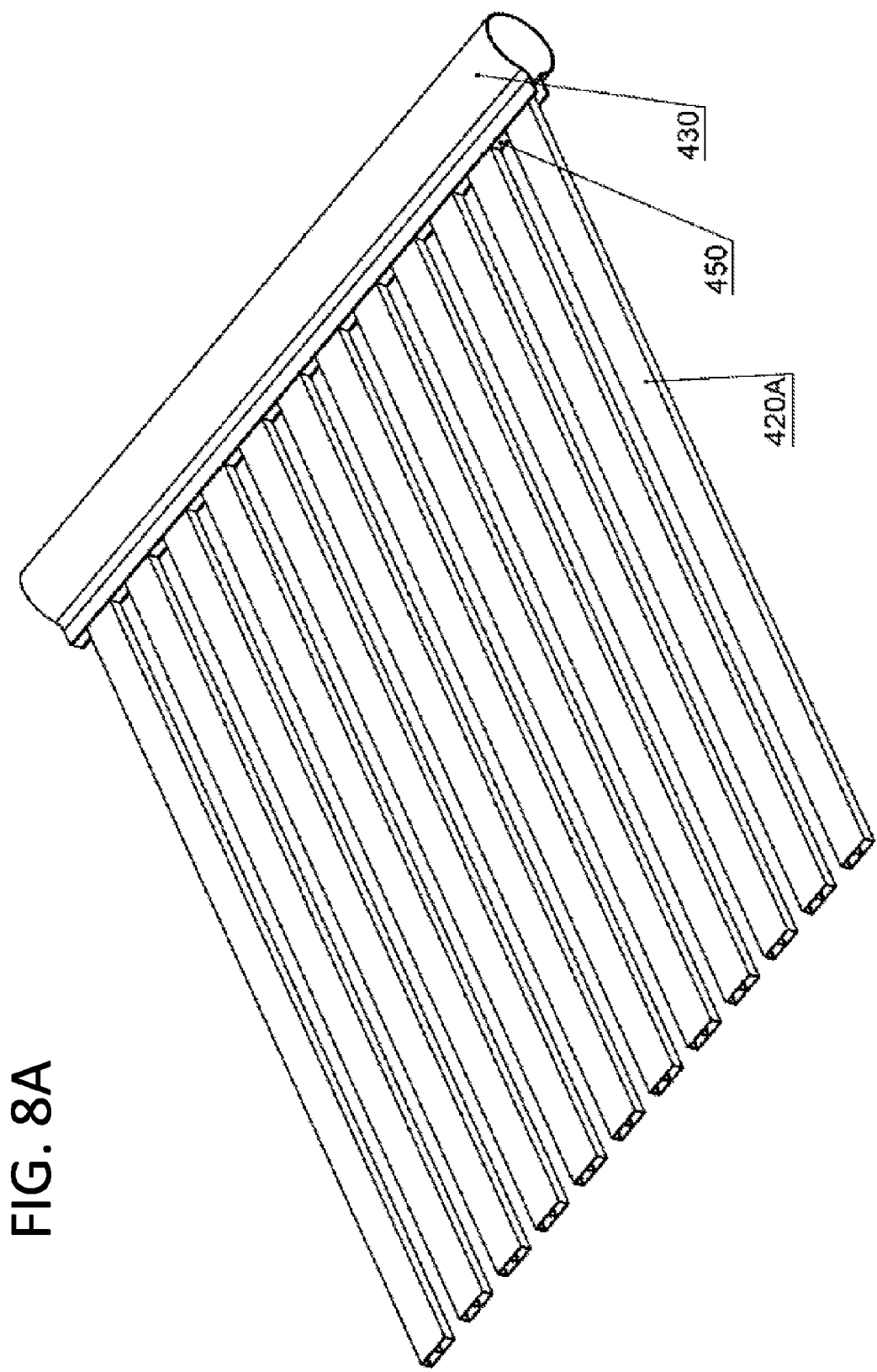
FIG. 8A is a perspective view of an alternative configuration for radiator 40, rows of parallel tubes 420A spaced periodically, which extend generally the length of the trough. The tubes 420A spaced by means of spacers 450. Tubes 420A are terminated in the radiator plenum 430 at both ends of the trough.
Figure 9:
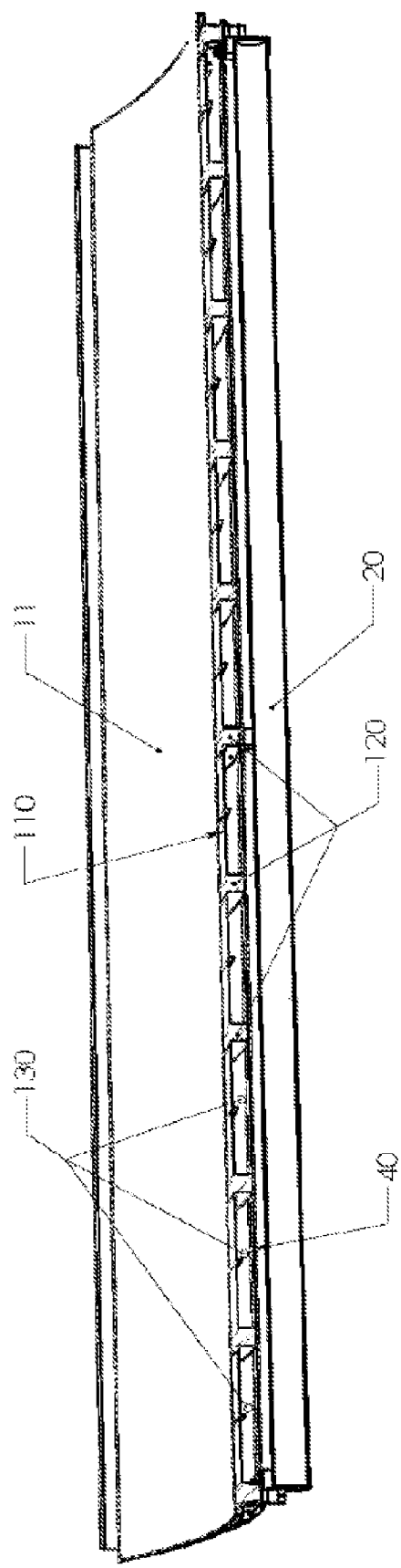
FIG. 9 is a longitudinal cross section view of an improved trough showing cooling channels 130 bounded by back shell ribs 120 on two sides, a back sheet 110, and a radiator 40. Mirror 11 is shown for reference.

Air flow channels 130, shown in FIG. 9, are formed by an area bounded between back shell sheet 110 on one side, a radiator 40 on the opposite side and finally by back shell ribs 120 forming a basic cell in the cross section of FIG. 9. These form multiple air flow channels 130, which follow the curve of the back shell, for air to flow, which aids in cooling. Air flow is facilitated in air flow channels 130 by a multitude of vent holes 105 along both side rails 140 of a trough, providing an exit and/or entrance, depending on trough orientation, to facilitate airflow. In one embodiment, a radiator 40 is constructed from flat sheets of aluminum or steel with rows of louvers 410 stamped in and rows of parallel radiator tubes 420 interspaced between the louvers 410, which can be seen in the detailed view of FIG. 8. In an alternative embodiment, a radiator 40 is constructed from rows of parallel radiator tubes 420A spaced (without a louvered sheet), which can be seen in FIG. 8A. By utilizing a radiator 40 so located, spread out over a large area on the back generally non-sun facing side of the trough, the cooling is enhanced by taking advantage of a large surface area which is exposed to the background environment, which will enhance thermal radiation heat transfer for cooling. Depending on the conditions, radiation heat transfer can account for up to 50% of the cooling capacity. This radiation heat transfer, in combination with natural convection from louver 410 and/or tubes 420(A), greatly improves cooling performance compared to a passive heat transfer arrangement.

Figure 10:
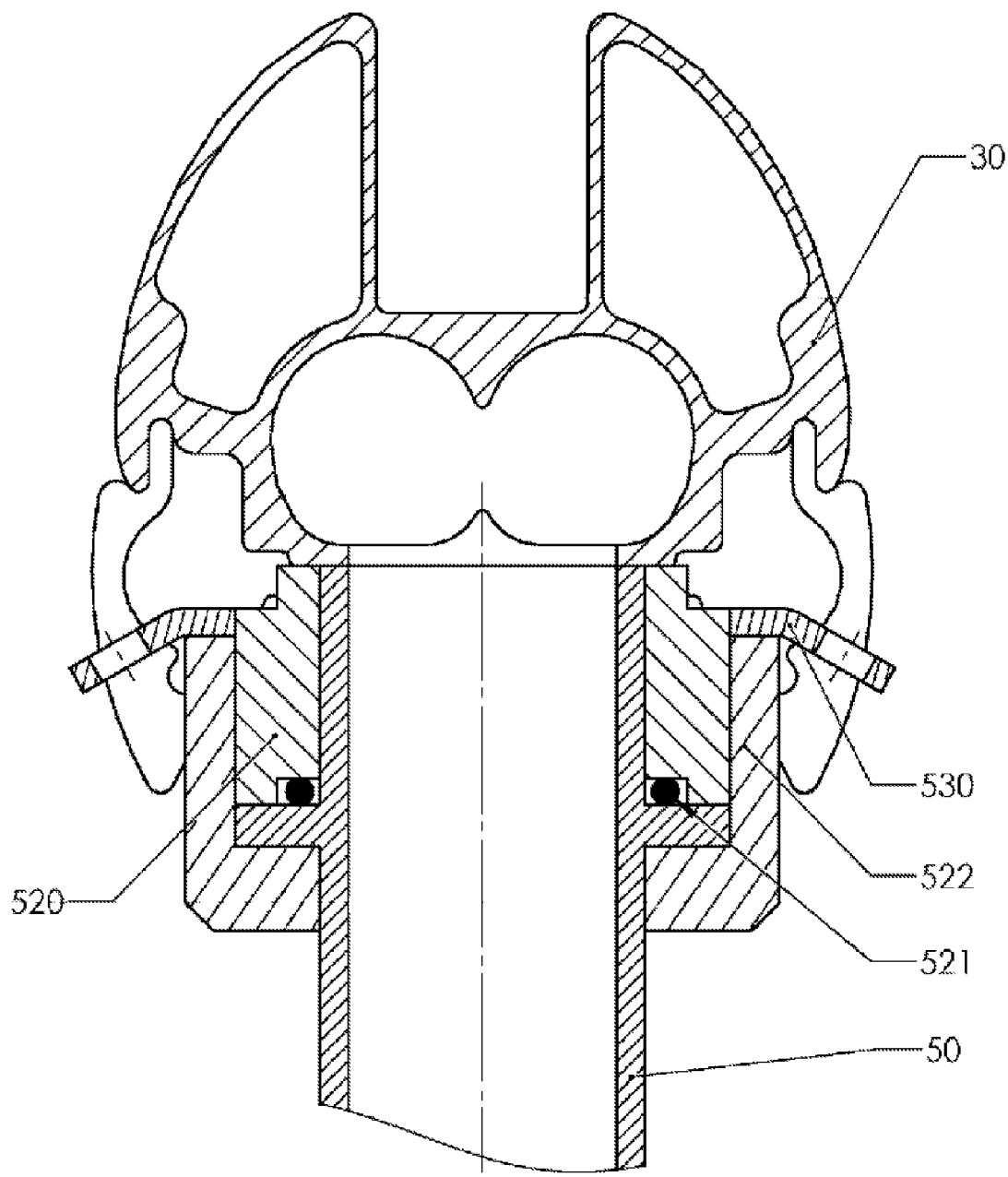
FIG. 10 is a section view of a fluid riser 50 attached to receiver by means of a fitting 520, which is threaded onto nipple 522, which is attached to receiver 30, and sealed by means of an o-ring 521, wire attachment ring 530 is provided for attachment of stabilizing wires 18 of FIG. 6.

Fluid riser and receiver support 50A, 50B are each intended as both the receiver support structure and fluid supplies tubes to the receiver. Thus, two functions are combined into one physical element saving weight and cost as well as reducing the area of potential light blockage compared to two components. This approach applies to both CPV and thermal concentration applications. FIG. 10 is a cross section detailing a connection to a receiver 30. The fluid riser is attached to a receiver by means of a threaded fitting 520, which is threaded onto threaded nipple 522, which is bonded to a receiver, and sealed by means of an o-ring 521. Receiver wire attachment ring 530 is provided for attachment of receiver stabilizing wire 18. Fluid riser and receiver support 50A, 50B is preferably made of Aluminum but can be any metal, plastic or composite material.

The heat transfer fluid passes into CPV receiver 30 from a fluid riser and receiver support 50, then having passed through receiver and picked up heat, fluid then passes out of the receiver down another fluid riser and receiver support 50 on the other end. The thus heated fluid leaving the fluid riser and receiver support 50 is passed via a tube to a radiator plenum 430, which traverses one end of the parabola along its curve. A radiator plenum 430 supplies fluid to radiator tubes 420, which extend the entire length of the parabola and distribute a heat across the surface of a radiator 40, cooled fluid is then collected by another identical radiator plenum 430 located on the opposite end of radiator 40. The thus cooled fluid is then passed to the next trough in the string. Fluid flows at a generally equal rate through all radiator tubes 420 by means of employing equal and opposite pressure drops in the opposing radiator plenums 430. This is accomplished by having the fluid enter the inlet plenum on one corner and exit the opposing plenum on the opposite corner. In so doing the fluid path and resistance along that path are the same for all paths. Therefore, flow is generally the same for each tube 420. In an alternative configuration, a radiator 40 is not integrated into the main structure but is discretely attached to the backside of a trough structure. In another alternative, a radiator 40 is displaced from a trough structure and place close to the ground below the trough in a stationary position. In yet another alternative, a radiator 40 is not present and all fluid is collect to a central system where it can be used for beneficial purposes.

Figure 23:
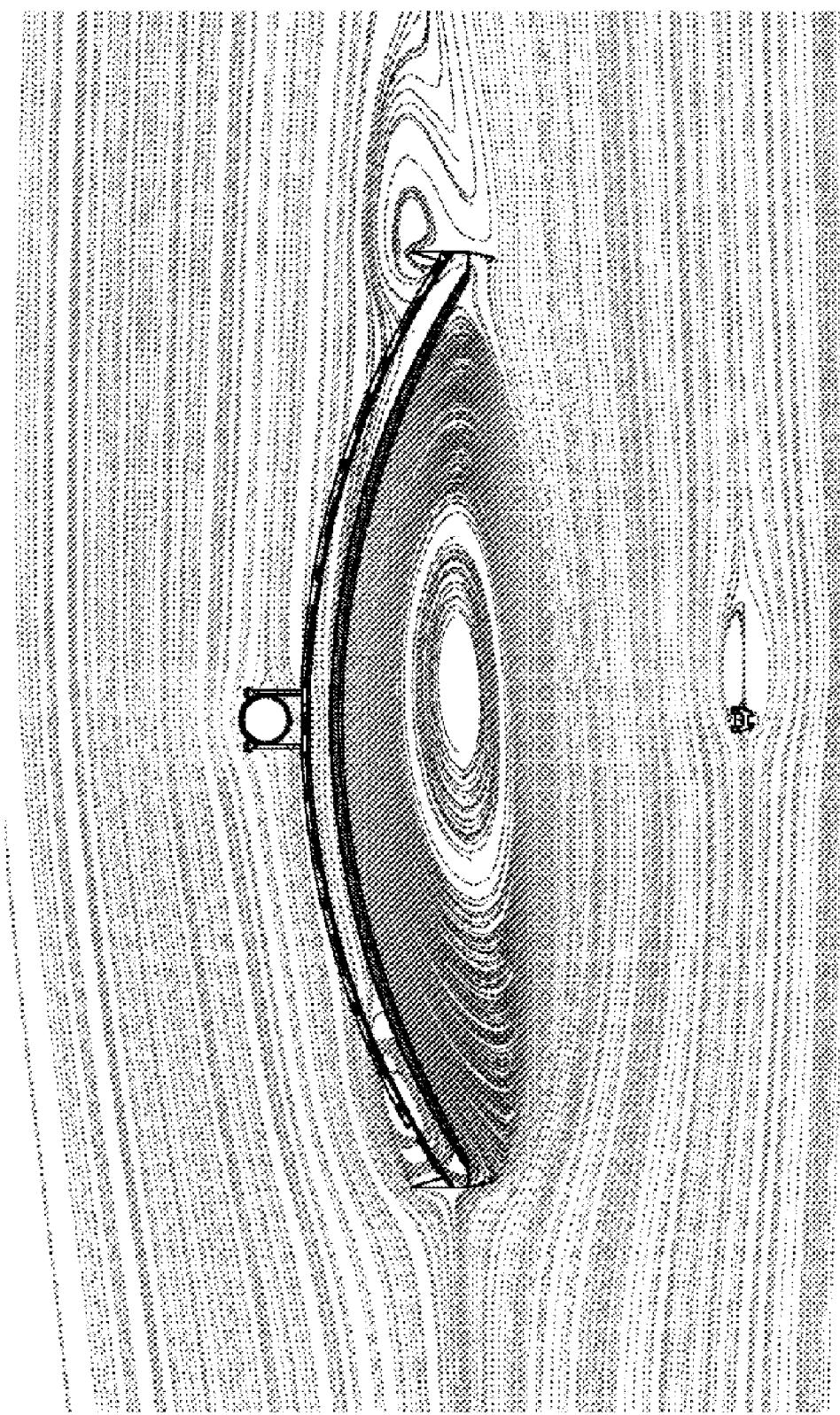
FIG. 23 is a end view of a trough module with the air flow pattern for 60 m/s (134 mph).

A parabolic trough would normally act as a wing in high speed wind conditions. However, the combination of aerodynamic elements, anti-lift aero balance tube 20, and combined aerodynamic spoiler and stiffener 15, work together to dramatically reduce lift and torque forces in very high wind conditions (e.g., hurricane/tornado). Such combination results in induced lift and torsion forces from high speed winds that are a small fraction of what they would be without the aerodynamic alterations. FIG. 23 shows a cross section of the module with the air flow pattern for 60 m/s (134 mph). In FIG. 23, it can be observed how the air flow patterns are disrupted. The resultant lift forces on the trough are reduced by roughly 90% compared to the trough without balanced aerodynamic control elements.

Figure 6:
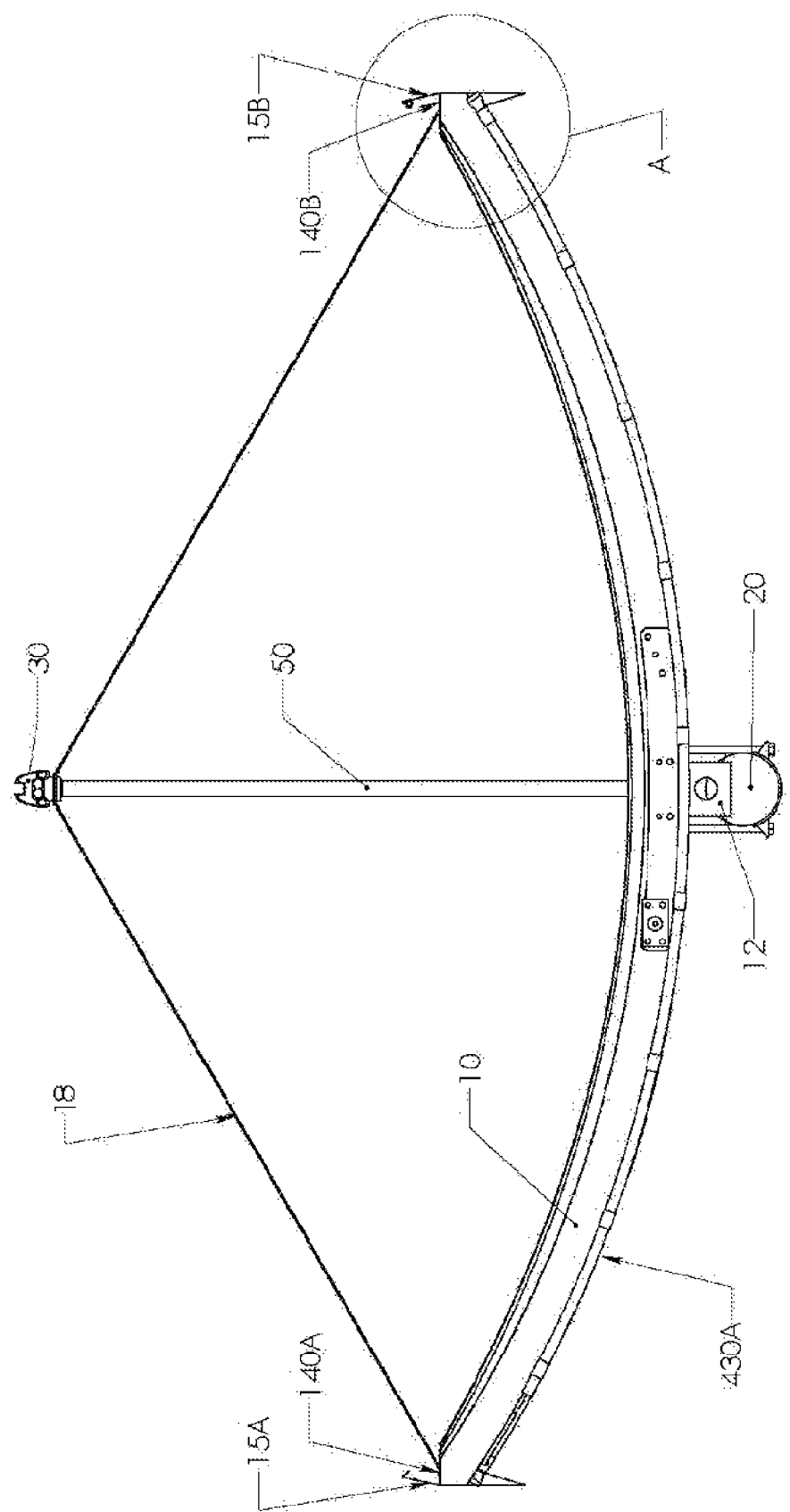
FIG. 6 is an end view of an improved trough assembly.

Combined aerodynamic spoiler and stiffener 15 generally extends the length of a trough longitudinally on the outer edge on each side, as shown in FIGS. 4 and 6. It has two primary functions: one is to work in combination with the anti-lift aero balance tube 20 to change the pattern of the wind flowing over the trough. The second is to further serve the purpose of adding stiffness to the trough, in another example of structural integration of traditionally non-structural elements.

Figure 7:
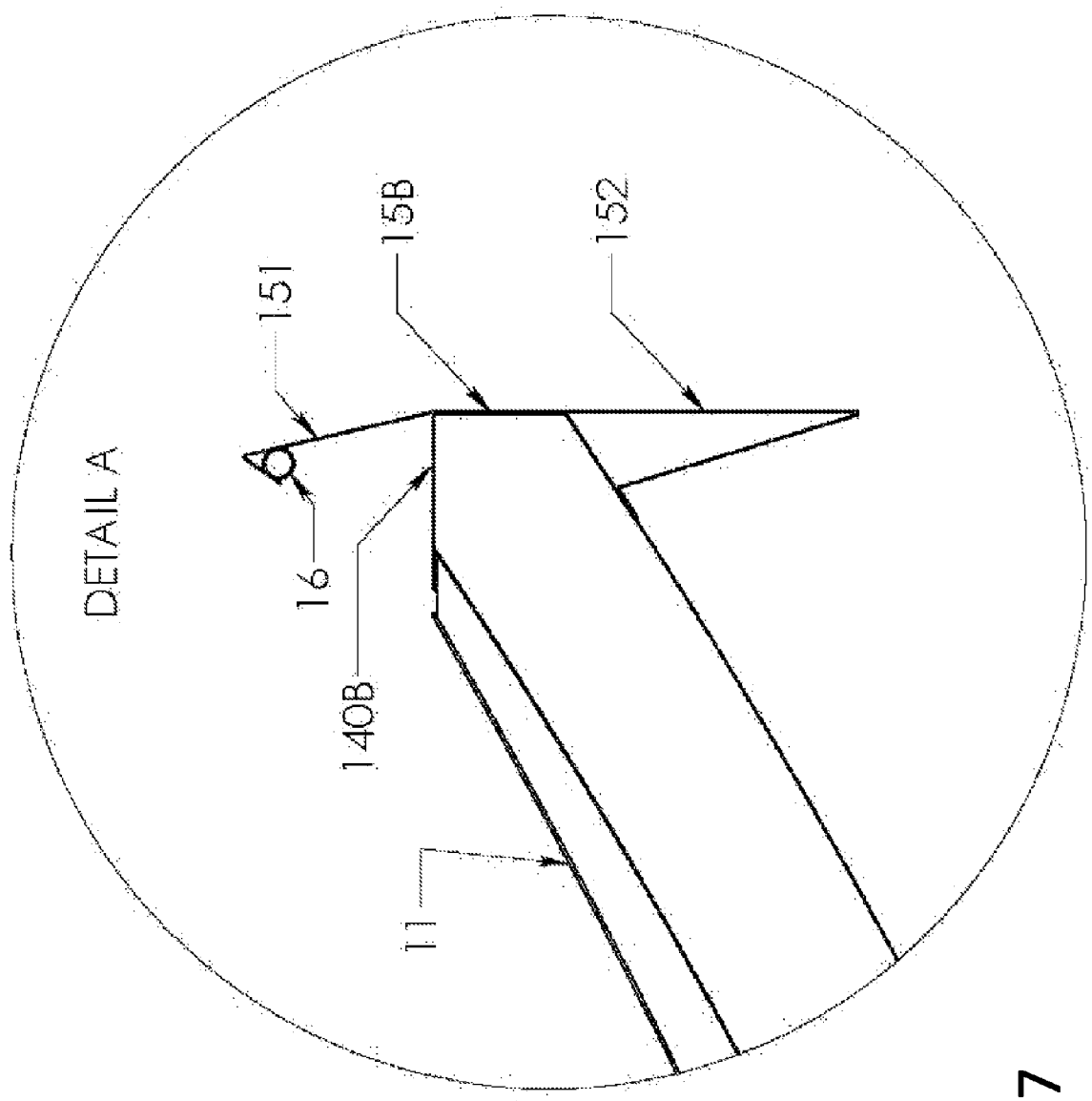
FIG. 7 is detail A view from FIG. 6, of a cross section of the aerodynamic spoiler and stiffener 15. Shown are aerodynamic spoiler and stiffener 15 has two primary parts, lower lip 152, which extends below the rim of the parabola and upper lip 151 which extents above the rim of the parabola, a side rail 140, and mirror wash tube 16.

Combined aerodynamic spoiler and stiffener 15 has two spoiler sub-elements: lower lip 152, which extends below the rim of the parabola; and upper lip 151, which extents above the rim of the parabola. In another minor purpose, upper lip 151 also serves to attach and hold a wash tube 16, as shown in FIG. 7. A further function is to provide a surface to stand the trough on its side during shipping. Aerodynamic spoiler and stiffener element 15 is preferably fabricated from steel, but may be of Aluminum or composite material. A roll forming process is the preferred fabrication technique but, alternatively, bending on a metal brake is possible.

Another aerodynamic control element, anti-lift aero balance tube 20, is a generally circular tube that extends the length of a trough on the backside, below the vertex of the parabola. By sizing and correctly spacing anti-lift aero balance tube 20 away from the surface of the back shell 100 and/or radiator 40, whichever is present, the anti-lift aero balance tube works in conjunction with the aerodynamic spoiler and stiffener element 15 to control lift and torque due to high winds. Anti-lift aero balance tube 20 is attached to and supported by the trough, preferably at three points but other supports may be acceptable. Preferably made of steel but can be Aluminum or other metal, plastic or composite material. Alternatively, the tube may have another cross section other than generally circular. Element 20 can also be used to increase cooling capacity by adding cooling lines, interiorly or exteriorly, to distribute heat over the surface, thereby dissipating additional heat. A general tubular structure in this general location has sometimes been used in past trough designs purely for structural reasons but not for aerodynamic reasons; such tube was often referred to as a "torque tube". In this invention, tube 20 does not serve as a torque tube. In yet another alternative embodiment, the tube can have the additional purpose of integrated structural member to increase the flexural stiffness of the trough if needed.

Mirror wash tube 16, shown in FIG. 7, is provided for automated cleaning of the mirror 11 surface. Mirror wash tube 16 is preferably mounted to upper lip 151 of combined aerodynamic spoiler and stiffener 15. Mirror wash tube 16, which extends the general length of a trough, has a plurality of small holes evenly space along the length. These holes are oriented such that water or cleaning fluid jetted out under pressure will be directed onto the surface of a mirror 11. When a trough is placed at some angle, the fluid jetted from mirror wash tube 16 will traverse across the width of mirror 11 and exit the other side of the trough, thus cleaning the entire surface of mirror 11. Mirror wash tube 16 may be located along one or both sides of the trough. The tubes are preferably fabricated from aluminum or plastic.

Figure 12:
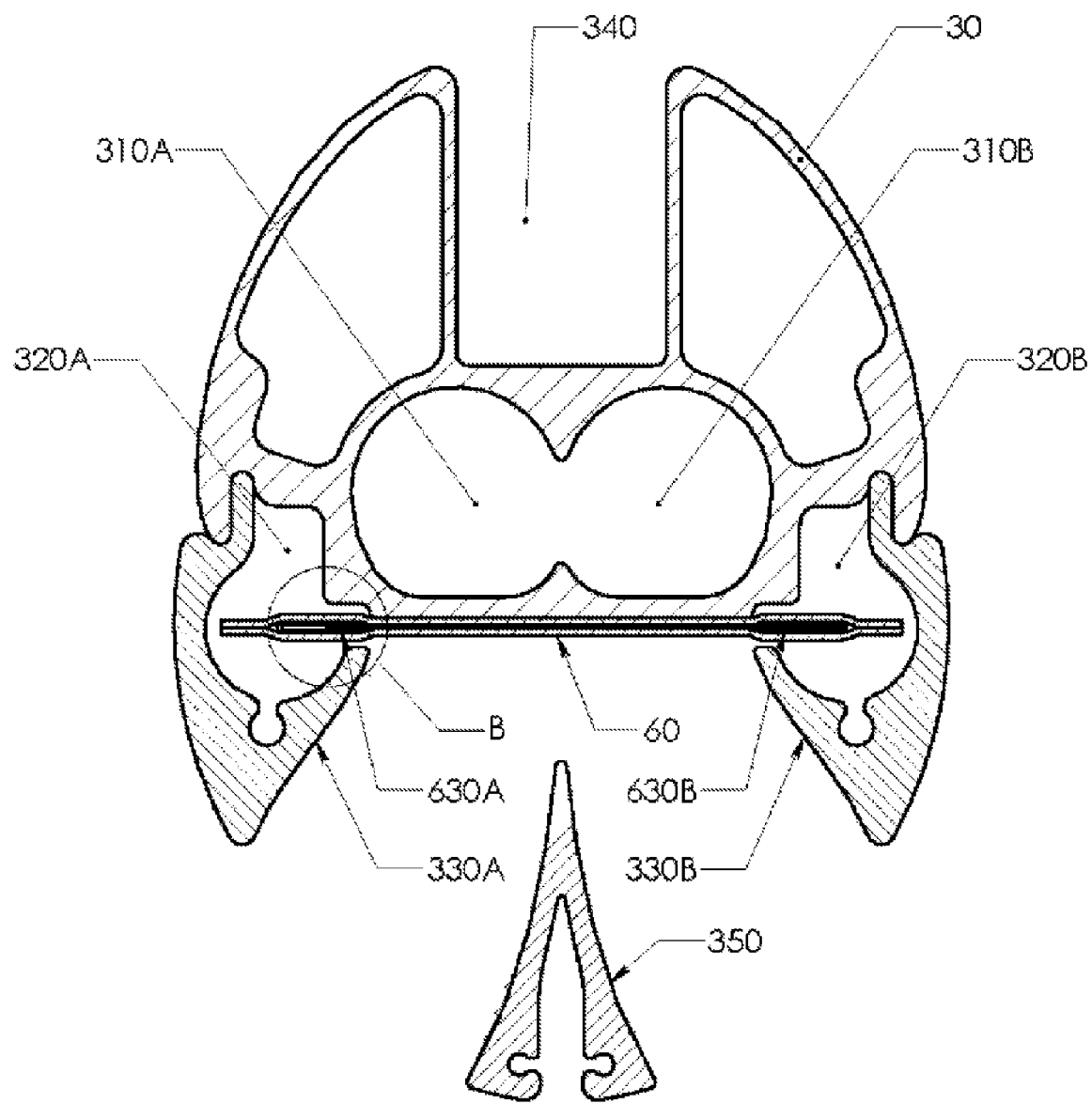
FIG. 12 is a section view of a concentrated photovoltaic receiver 30, a general rounded aerodynamic shape of receiver can be seen. 60 is an encapsulated solar array mounted on the heat transfer wall of the receiver (aka receiver face), receiver fluid channels 310 A&B opposite solar array mounting face, chambers 320 A&B along either side of the solar array are passages for wires, 630 A&B are PV cell buss bars hidden from sunlight by small side mirrors 330 A&B. 340 is solar alignment channel for locating solar tracking device. 350 is the Apex mirror for secondary concentration.

This invention incorporates a CPV receiver 30 design for liquid cooling. The general cross section of CPV receiver 30 is shown in FIG. 12. A primary objective of the liquid cooled CPV receiver 30 is to provide superior heat absorption into the coolant fluid (or heat transfer fluid) from the solar cells (i.e. for PV cell cooling). Coolant fluid is pumped through receiver fluid channels 310 A&B, which extend along the entire length of a receiver, shown in FIG. 12 as two channels joined but may be any number of channels. The fluid channels are collocated opposite a common wall, where the encapsulated PV array 60 is bonded on one side with the fluid channels 310 on the other side. A receiver also includes electrical wire channels 320 A&B, which extend the entire length of the receiver. Wire channels 320 A&B provide space for the solar cell interconnect, bypass diodes, wires and sensor leads, which may be needed for a PV array. CPV receiver 30 is preferably made of extruded Aluminum but can be any metal and formed by alternative process, such as roll forming or some combination of processes.

Figure 13:
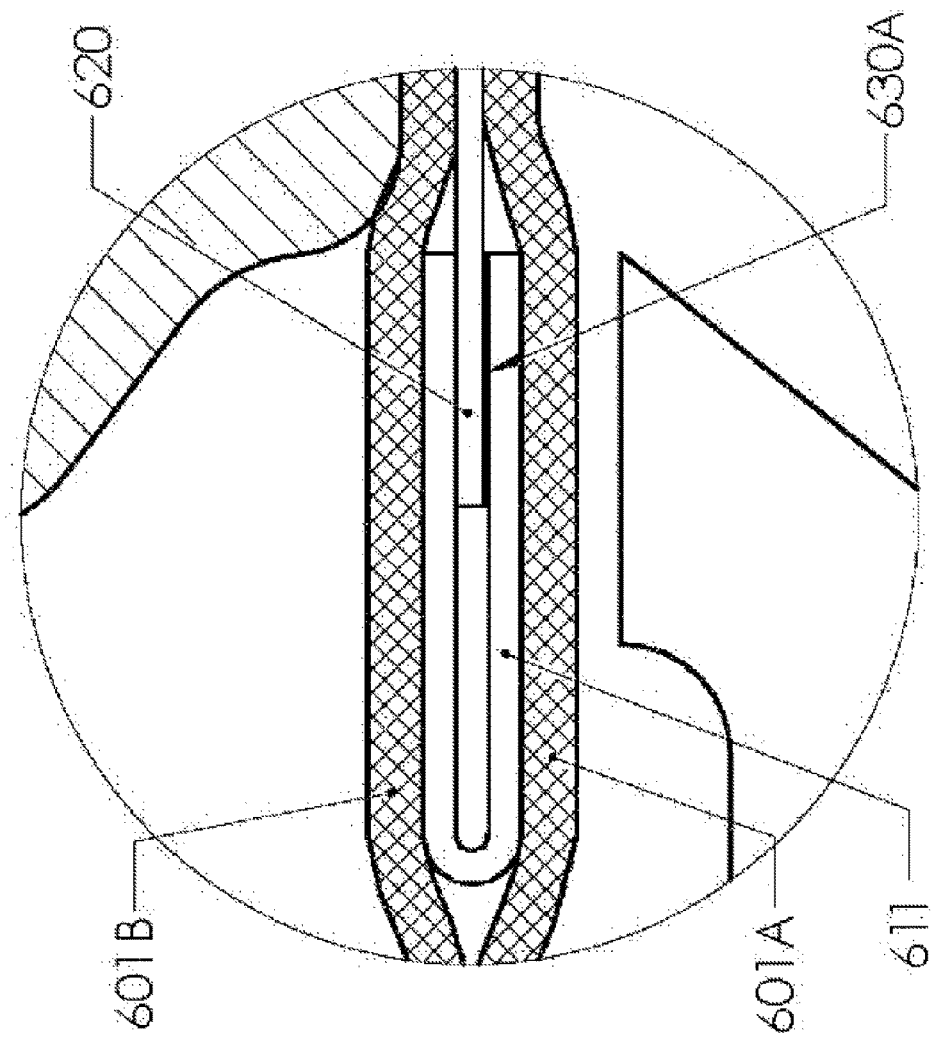
FIG. 13 is a detail view B from FIG. 12. It shows solar cell 620 with interconnect 611 attached to PV cell buss bar 630A. 601 A&B are front and back encapsulation layers respectively.

FIG. 13 illustrates detail B from FIG. 12, showing PV cell 620 with PV cell interconnect 611 attached to PV cell buss bar 630A. Not shown is 630B on the opposite longitudinal edge of PV cell 620, which has an identical configuration but with mirror interconnect 612. 601 A&B are front and back array encapsulation layers, respectively.

This invention includes two small side mirrors 330 A&B (A&B are identical), located in a CPV receiver 30 shown in FIG. 12. These small side mirrors 330 A&B serve to redirect a portion of the concentrated light onto the solar cells (i.e. increase the concentration factor and affect distribution of the concentrated light), producing a generally even light distribution as the trough tracks from side to side due to the relative motion between the sun's direct rays and the trough (distribution pattern detailed later).

FIG. 12 also shows an apex mirror 350. The apex mirror 350 serves essentially the same purpose as side mirrors 330, but for a different portion of the concentrated light. Further, in combination side mirrors 330 and apex mirror 350 concentrate the light further than is possible from the single focus of the main mirror. This in affect allows the utilization of smaller PV cells and consequently lower cost. With the addition of side mirrors 330 and apex mirror 350 the receiver has a much great acceptance angle for incoming light.

Figure 14:
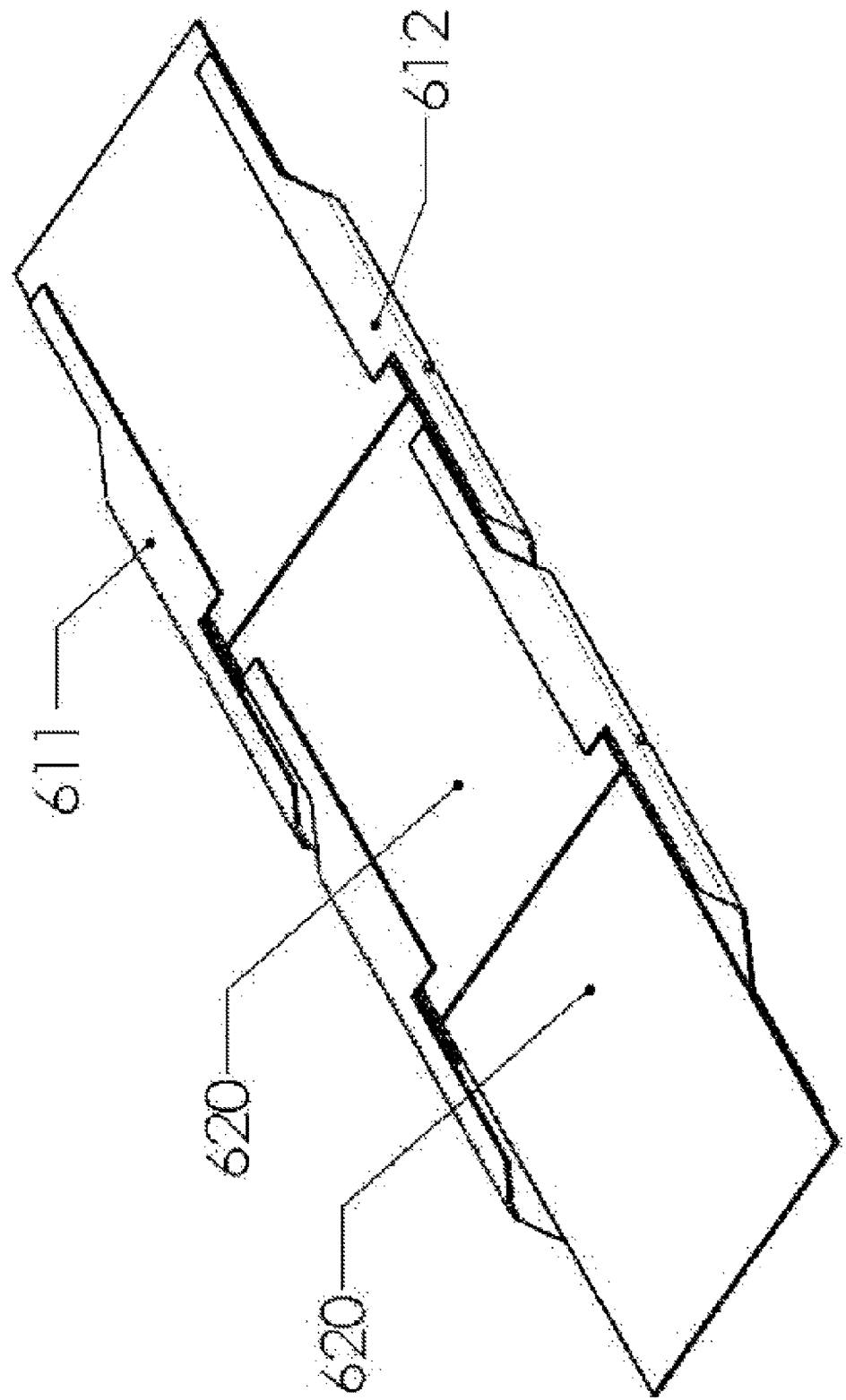
FIG. 14 is a perspective view of a PV cell interconnects 611 and 612 connecting cells, anode to cathode of PV cells 620 in a string, PV cell 620 back side (non-sun facing side) is shown in this view, PV cell buss bars are not visible.
Figure 15:
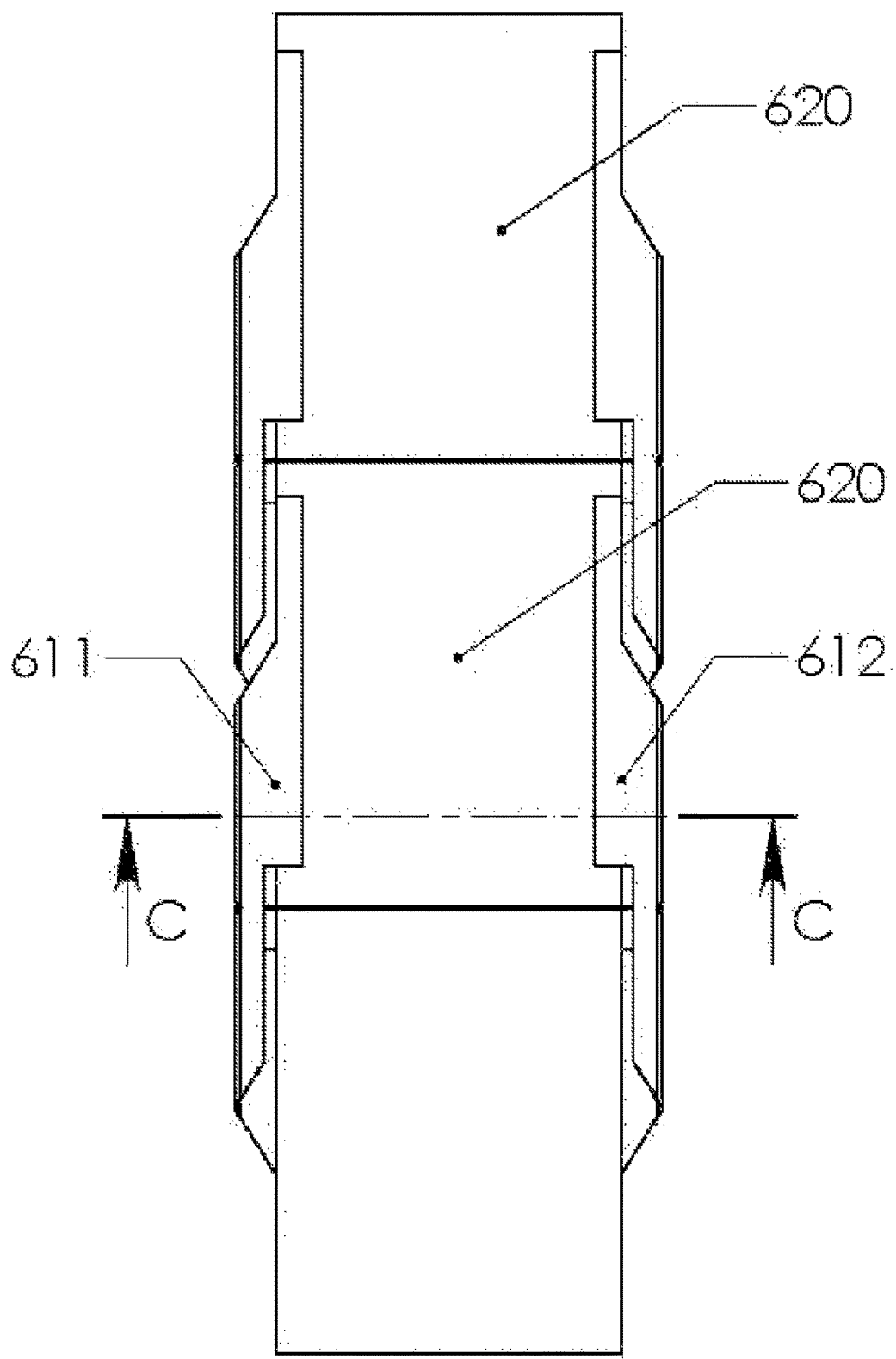
FIG. 15 is a top view of a PV cell interconnects 611 and 612 connecting cells, anode to cathode of PV cells 620, PV cell 620 back side (non-sun facing side) is shown in this view, PV cell buss bars are not visible.
Figure 16:
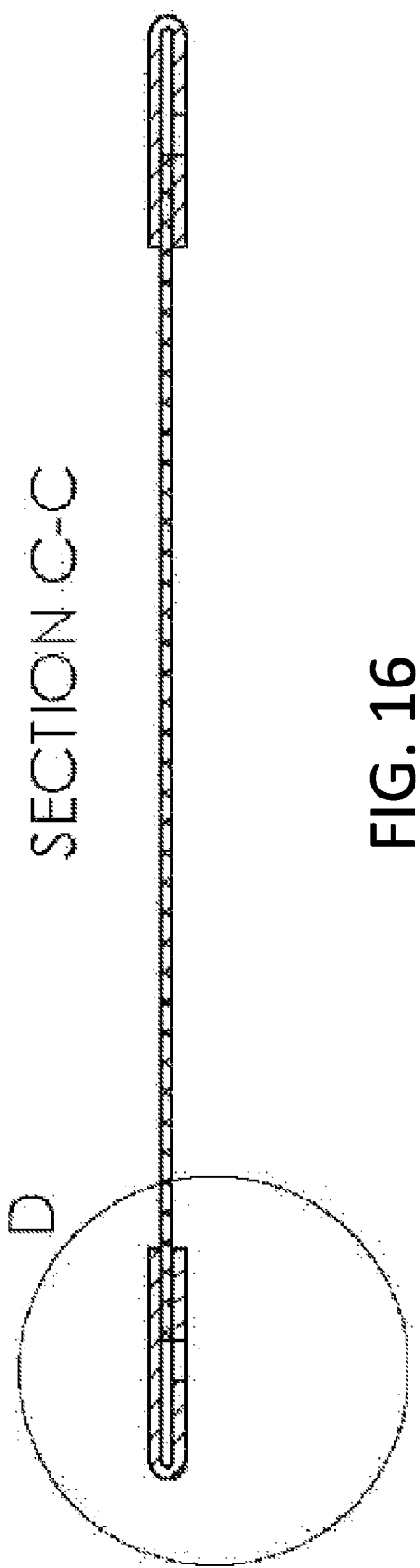
FIG. 16 is a section view along line c-c from FIG. 15.

Additionally, in order to maximize the light which strikes a solar cell(s) and thus maximize electric and/or thermal power output, this invention utilizes the small side mirrors 330 A&B as a feature which hides a PV cell buss bar 630 A&B and associated interconnect 611 & 612 from the concentrated light, thus improving effective efficiency. The small side mirrors 330 A&B serve this second purpose of shading or "hiding" by redirecting concentrated light away from the PV cell buss bars 630 A&B. Thus creating hidden buss bars and preventing the light, which would have impacted the buss bars, from being lost. PV cell buss bars 630 and associated interconnects 611 & 612 extend longitudinally along the sides of the PV cell 620, as illustrated in FIG. 14 & FIG. 15. When a cell or an array of cells is mounted in the receiver, as shown in FIG. 12 and detail FIG. 13, small side mirrors 330 cover PV cell buss bars 630, minimizing the loss from light normally reflected by/from the buss bars and thus not absorbed by a PV cell 620. Small side mirrors 330 A&B are intended to be attached to CPV receiver 30 after an encapsulated PV array 60 is bonded in place, this makes solar cell string mounting easier. Alternatively, small side mirrors 330 may be integral to the main body of a receiver and a PV cell array inserted from the end. The preferred method of fabrication is to extrude the small side mirrors 330 from aluminum, steel, plastic or composite material and then to laminate or deposit a mirror surface on the face. Alternatively, it is possible to manufacture small side mirrors 330 by machining process of milling the profile required from a solid piece of material of the same selection.

Figure 11:
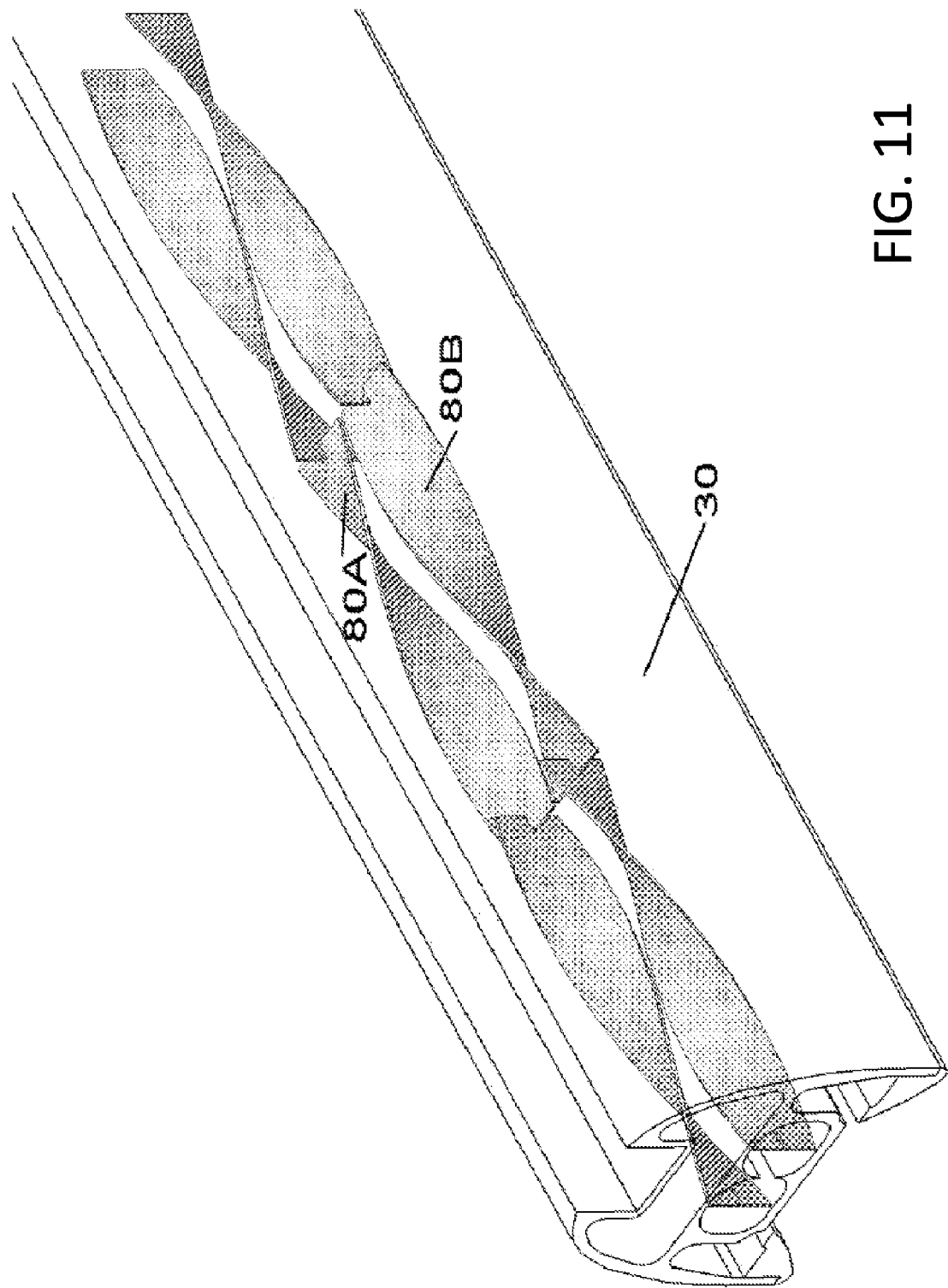
FIG. 11 is a perspective view of a CPV receiver 30. Coolant fluid flow mixers 80 A&B, which are located in the internal receiver fluid channels, are revealed.

In order to get the best heat conduction into the fluid it is desirable that the fluid should be turbulent which breaks up the boundary layer, but it is also desirable to minimize the pumping power and pressure losses. Low pressure drop, and thus low relative pumping power, are generally inconsistent with producing turbulent flow. Therefore, this design incorporates flow mixers 80 A&B (A&B are identical), which are located in the receiver fluid channels 310 A&B. Flow mixers 80 cause the flow to swirl and mix, thereby generally eliminating the boundary layer, which improves heat transfer to the fluid. These flow mixers 80 cause relatively low pressure loss compared with high a Reynolds number associated with turbulent flow. FIG. 11 shows and perspective view of the receiver with internal flow mixers 80 revealed.

Further, this CPV receiver 30 design incorporates an aerodynamic shape for low coefficient of drag, where generally rounded sidewalls slope in at the top and at the bottom, which can be seen in cross section FIG. 12. During high wind conditions, the drag force exerted on a receiver due to such winds can be significant. These forces would be transferred to a trough causing a torque on a trough and its tracking drive, potentially damaging other components. By designing a receiver with a low coefficient of aerodynamic drag, the forces can be greatly reduced.

All parabolic trough concentrators need to be aligned with the sun at least along the long axis of the trough. This invention includes an external longitudinal channel, called the receiver solar alignment channel 340 in FIG. 12, which extends along the length of a receiver on the general sun facing side, opposite and parallel to the surface where an encapsulated solar array 60 is to be mounted. Receiver solar alignment channel 340 is to be used to align the trough with the sun. More precisely, receiver solar alignment channel 340 is for locating a solar alignment sensor and or solar tracking device.

In an alternative embodiment the features represented here for a CPV receivers, side mirrors, flow channels, flow mixers, aerodynamic shape, and alignment channel, can also be applied to thermal receivers for high temperature thermal applications, i.e. a receiver without PV cells for heat only.

Figure 17:
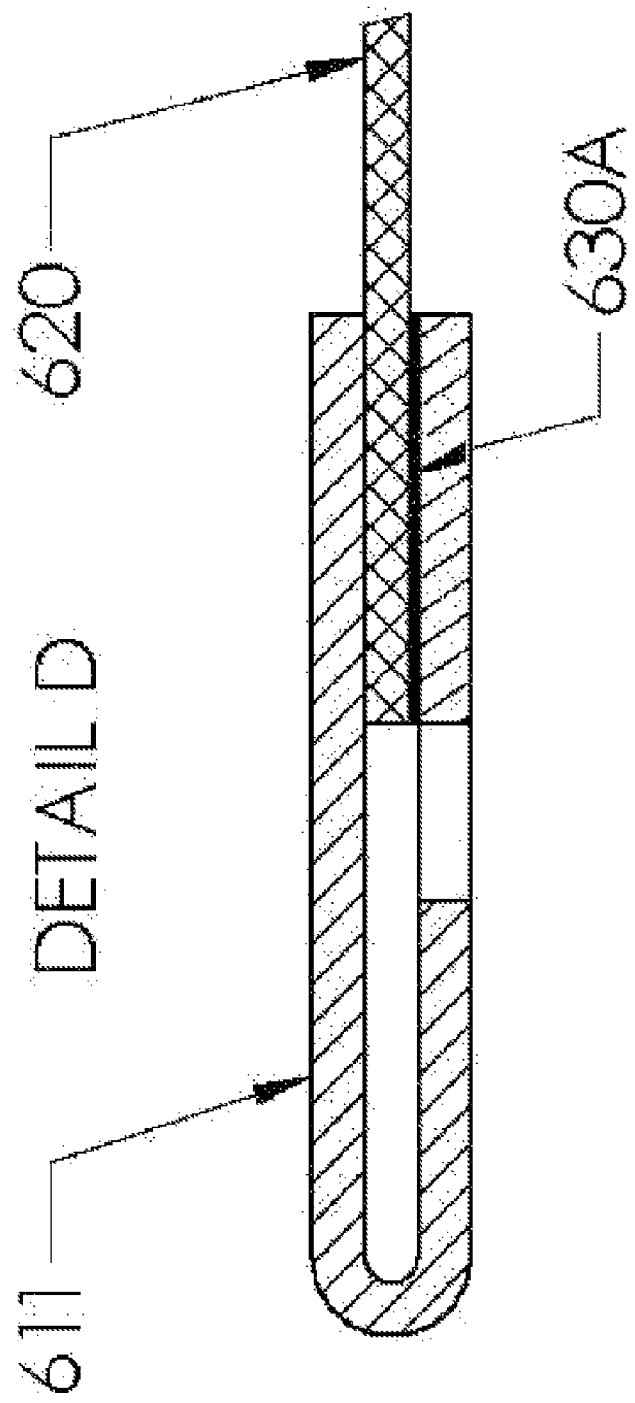
FIG. 17 is a detail view of D from FIG. 16. This shows a close up of a cross section of an interconnect 611 as connected to a cell 620 with buss bar 630A.
Figure 18:
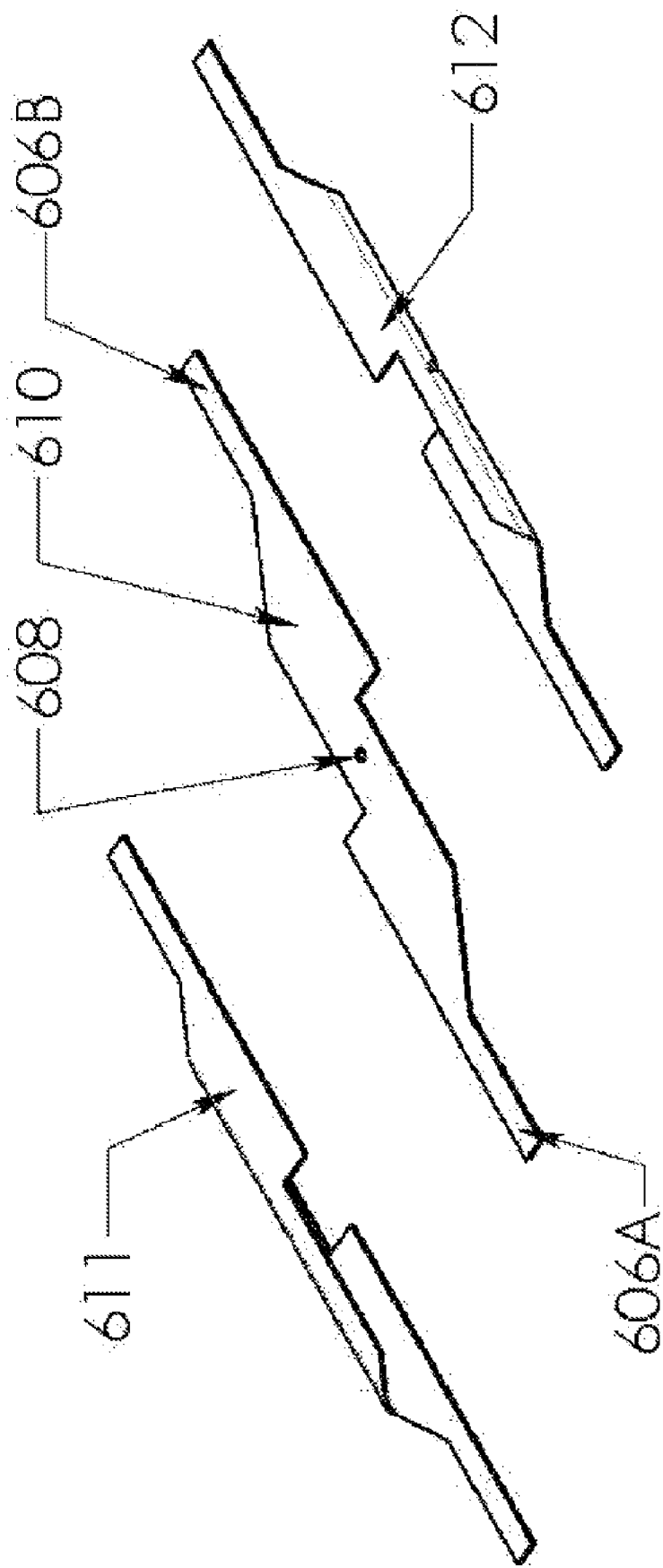
FIG. 18 is perspective views of a cell interconnects, oppositely folded 611 & 612 and unfolded 610 (i.e. as stamped blank) interconnect device. 606 A&B are tabs that are to be soldered to the PV cell anode and cathode. 608 is a small through hole stamped in interconnect for location of cell isolation rod.

In order to minimize losses, the cells in CPV applications need to be as closely connected as possible. This invention includes a device for interconnecting the solar cells by means of a PV cell interconnect 611 and mirror image PV cell interconnect 612, which extend along the sides of a solar cell on opposite edges. This eliminates the need to use the traditional flexible tabs that usually extend between the cells, requiring a larger gap than desired here. Close spacing of solar cells 620 requires a different method from traditional interconnecting of cells in a string or array. PV cell interconnect 611 and mirror image PV cell interconnect 612 are intended to facilitate close spacing of solar cells 620 when connected in an array. Since a parabolic trough is a linear focus concentrator, the solar cells extend one next to the other in a line or linear array at or near the focal point, or more accurately along the focal line, as illustrated in FIG. 19 through FIG. 22 for PV array placement near the focal point. Installed PV cell interconnects are illustrated in FIG. 13 through FIG. 17. FIG. 17 detail D of section C-C is essentially the same view as detail B in FIG. 13, but only of a bare cell and interconnect without encapsulate and not mounted in a receiver. PV cell interconnects 611 & 612 have two tabs 606 A&B, which are generally symmetrical. These tabs are to be connected to the solar cell anode and cathode generally by means of soldering one tab is soldered to a solar cell buss bar 630 and the other is solder to the back of an adjacent cell. Interconnects are preferably made of Copper but they can be of any high conductive metal. Interconnects are preferably fabricated by means of first stamping from flat strips to produce the interconnect blank 610, then folding a blank 610 in one direction to produce PV cell interconnect 611 and folding another blank 610 in the opposite direction to produce mirror image PV cell interconnect 612. FIG. 18 illustrates the stamped blank 610 and the two oppositely folded interconnects 611 & 612. Folding of interconnect blank 610 is preferably accomplish by roll forming but can also be by other process such as stamping etc. Interconnect blank 610 is folded so that connecting tabs 606A & 606B are on parallel planes but displaced by the thickness of the cell as shown in FIG. 17 detail D. A small hole 608, shown in interconnect blank 610, remains in interconnect 611 & 612 and is to provide means of inserting and holding a generally circular insulator intended to prevent adjacent cells from touching and thus electrically shorting. Interconnects have the added benefit that their overall resistance is lower than traditional tabs, because it can be made with a much greater cross section area than the traditional tabs used for connecting PV cells thus the resistive losses are reduced. FIG. 14 and FIG. 15 show how PV cells 620 are to be interconnected in a string using PV cell interconnects 611 & 612. Additionally the PV cell interconnects 611 & 612 provide a convenient means of attaching wires and bypass diodes, either surface mount or axial lead, should they be required. There are many alternative configurations of the PV cell interconnect 611 & 612 but the base elements are that the device should connect the bus bar anode on one face of a cell to the cathode on the opposite face of and adjacent cell and so forth in series. In addition, it should not intercede between the cells but instead pass along the side to allow for minimum cell spacing.

Figure 19:
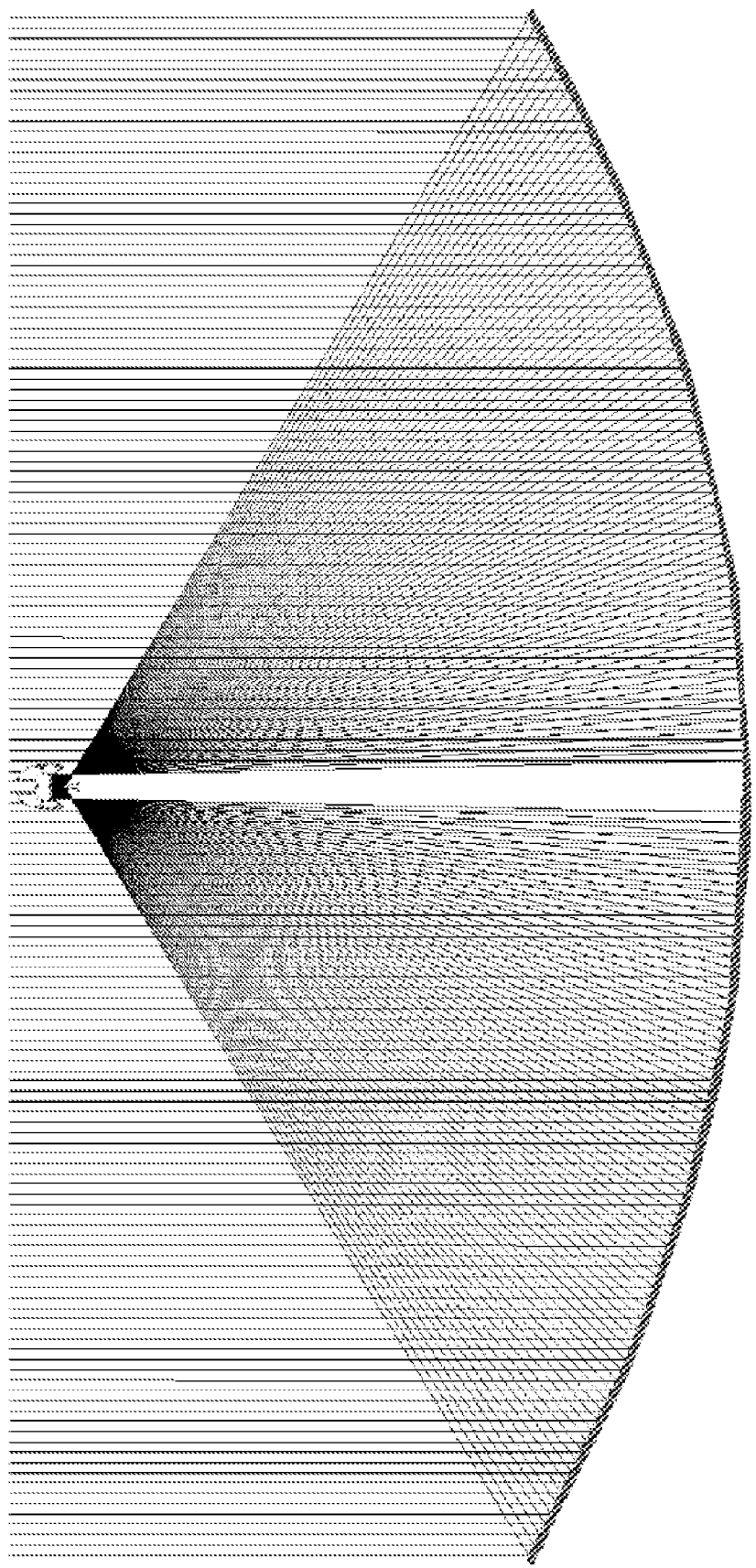
FIG. 19 is an end view of overall general light concentration pattern for a cross section of the trough, with idealized parallel rays and perfect specular reflection from the main mirror 11.
Figure 19A:
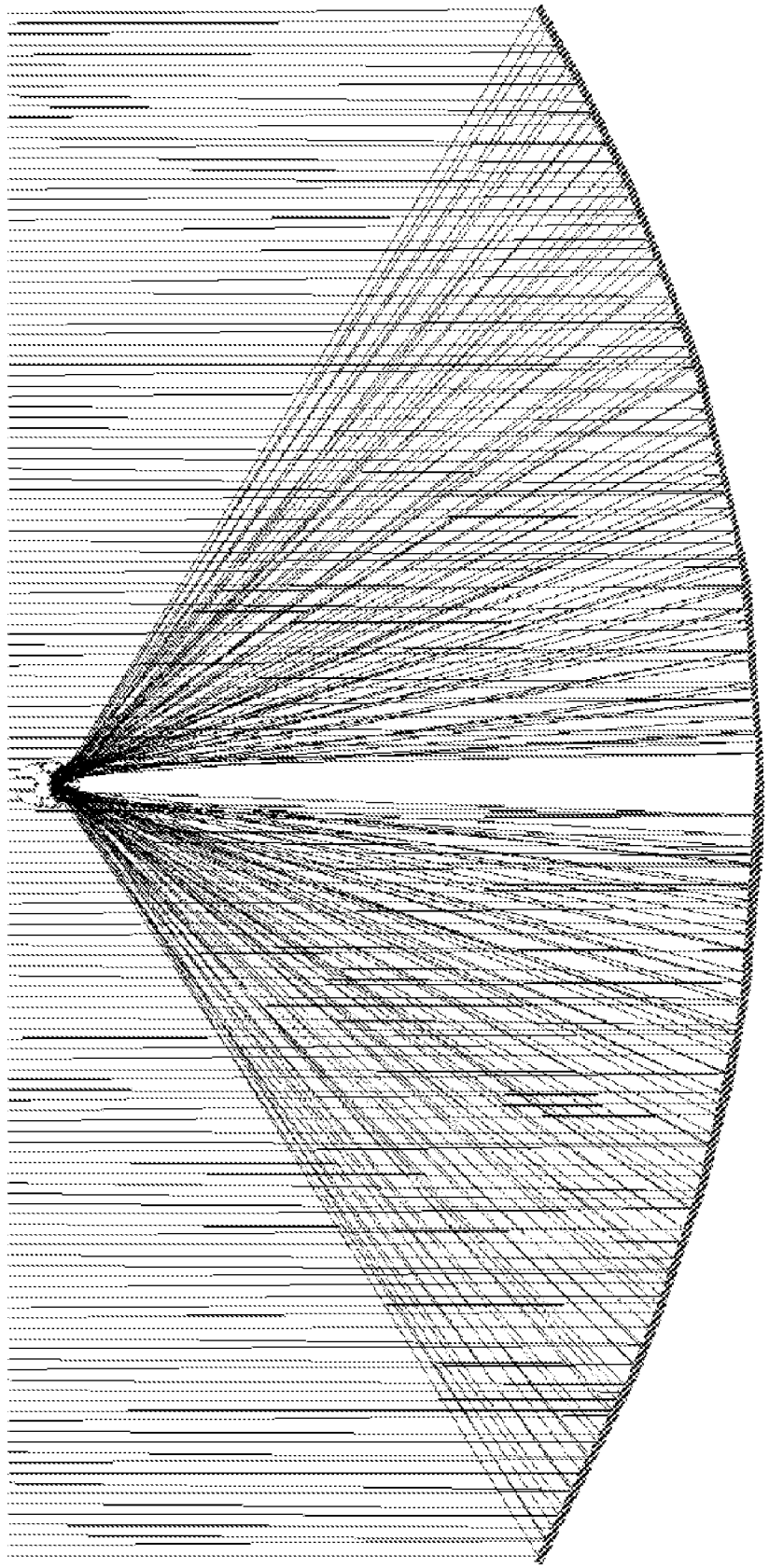
FIG. 19A is an end view of overall general light concentration pattern for a cross section of the trough, with non-parallel solar rays and imperfect specular reflection from the main mirror 11.
Figure 20:
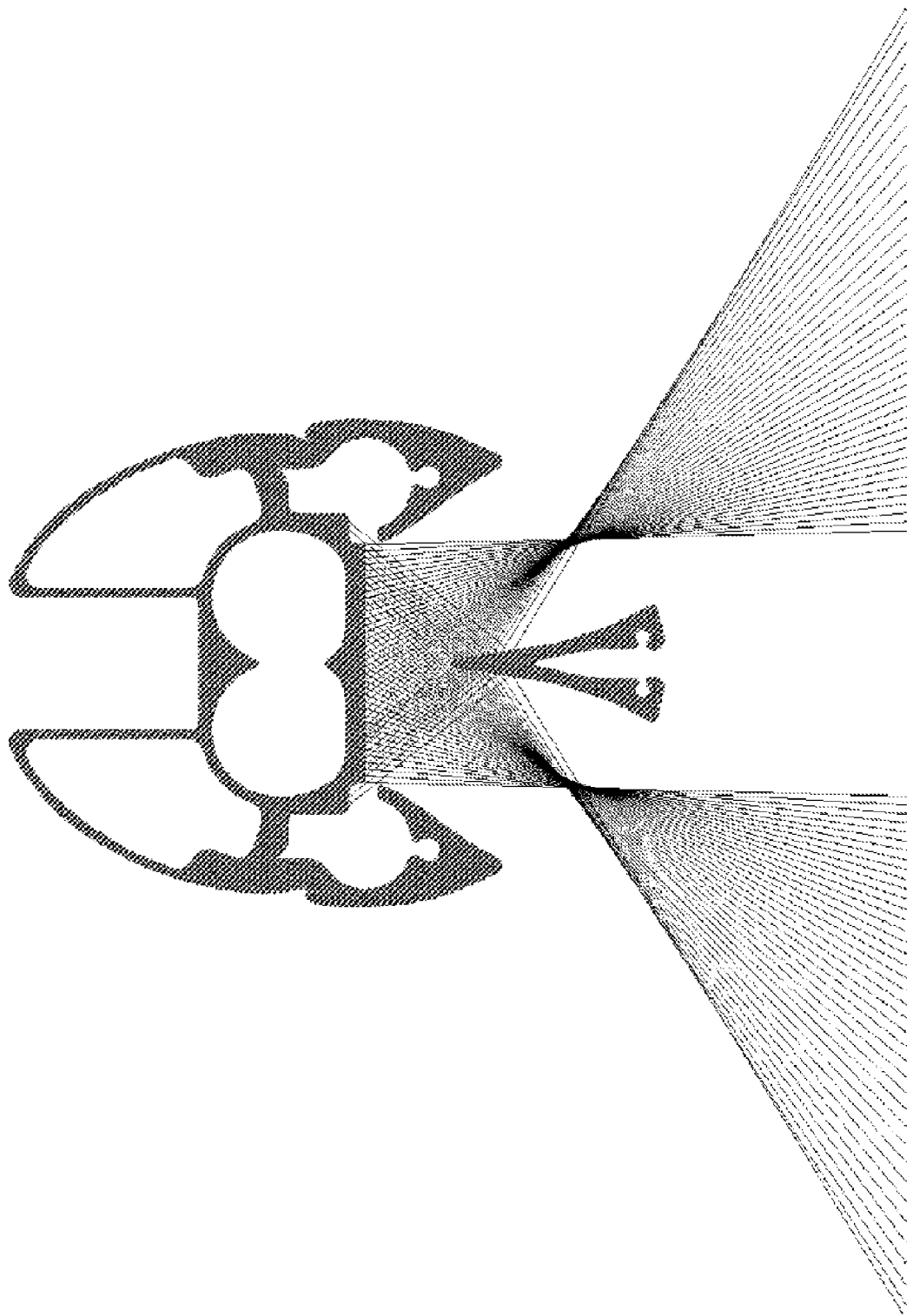
FIG. 20 is a cross section close up, at the receiver, of the pattern of light concentration shown in FIG. 19, it also shows a portion of the rays reflected by the side mirrors and the apex mirror. This is the concentration pattern of idealized parallel rays and perfect specular reflection.
Figure 20A:
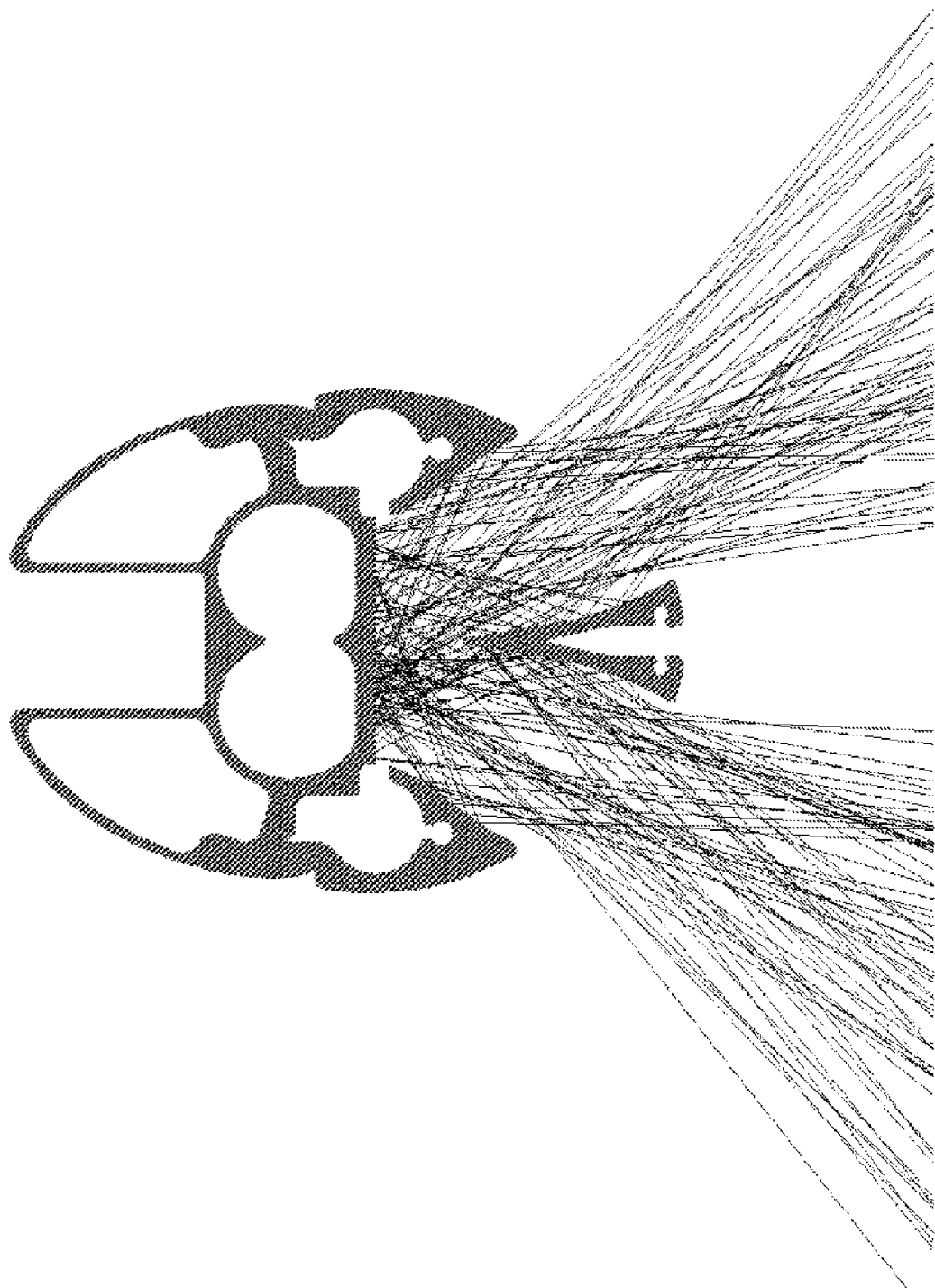
FIG. 20A is also a cross section close up, at the receiver, of the pattern of light concentration shown in FIG. 19A, it also shows a portion of the rays reflected by the side mirrors and the apex mirror. This is the concentration patter of real solar rays and imperfect specular reflection.

To achieve the highest possible efficiency from the solar cell, light distribution should be maintained as near even as possible across the cell face. An aspect of this invention includes a method of evenly distributing concentrated light over the surface of the encapsulated PV array 60. FIG. 19 shows the overall concentration pattern in neutral position for the full cross section of an improved parabolic trough with ideal parallel rays and perfect reflection. FIG. 19A shows the same except with non-ideal solar rays and imperfect specular reflection. As can be seen in FIG. 20, close up of FIG. 19, the concentration pattern in neutral position, rays from each half of a parabola, left and right, do not significantly cross each other before impacting a secondary mirror or PV array 60, thus concentrated rays have a dual focus pattern and not a single focal point as in state of the art parabolic concentrators. Again FIG. 20A is the same as 20 but with non-idealize rays and imperfect reflection. This dual focus pattern generally leaves an area below a receiver 30, and with the approximate width of the solar cell, open between a mirror 11 and a receiver 30. This area is intended to accommodate the apex mirror and/or fluid riser and receiver support 50 A&B, which will have minimal light interference so located.

Figure 21:
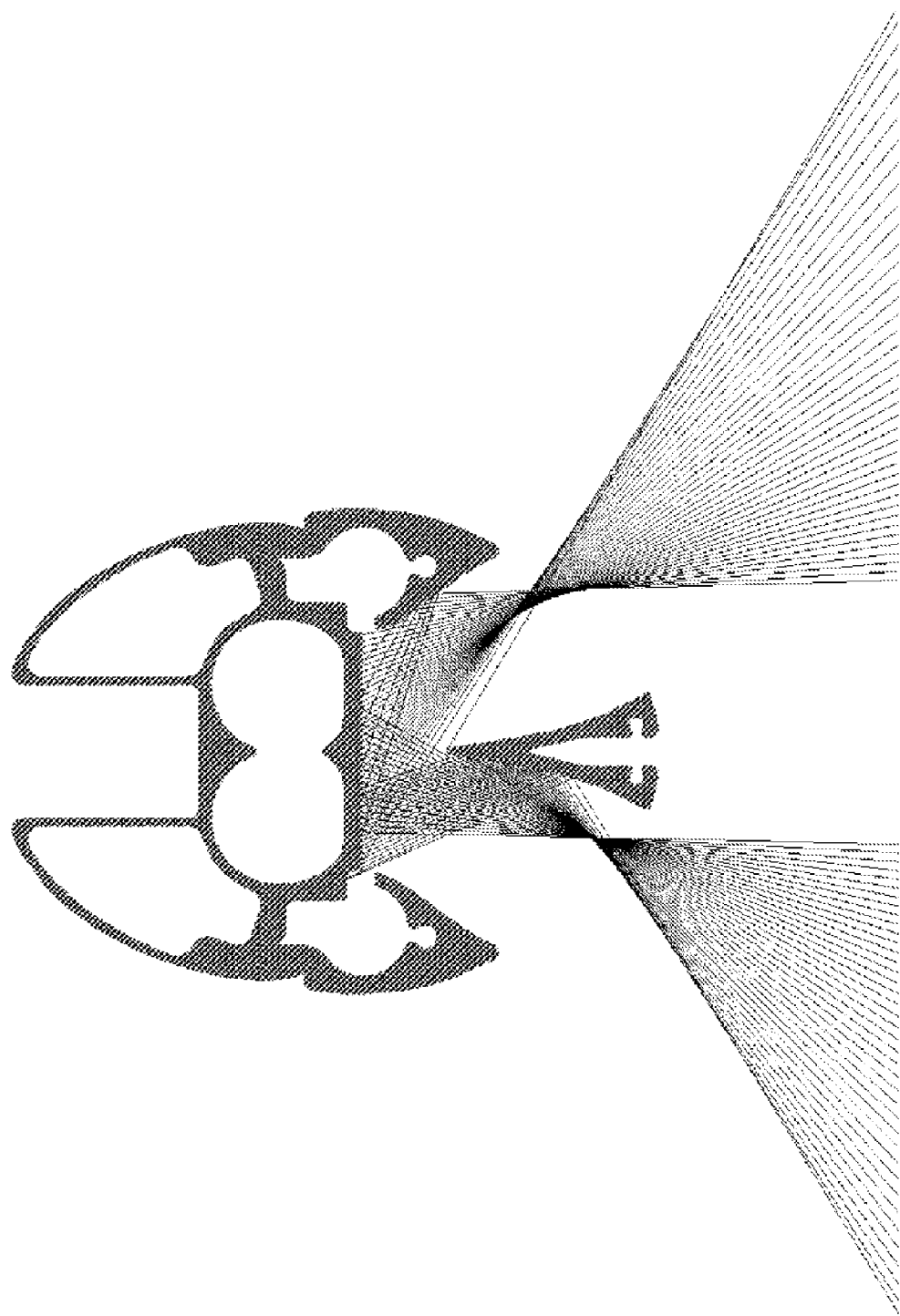
FIG. 21 is a cross section close up, at the receiver, of the concentration pattern of parallel incoming rays with perfect specular reflection, when the trough is 0.075 degrees off center i.e. during solar tracking.
Figure 21A:
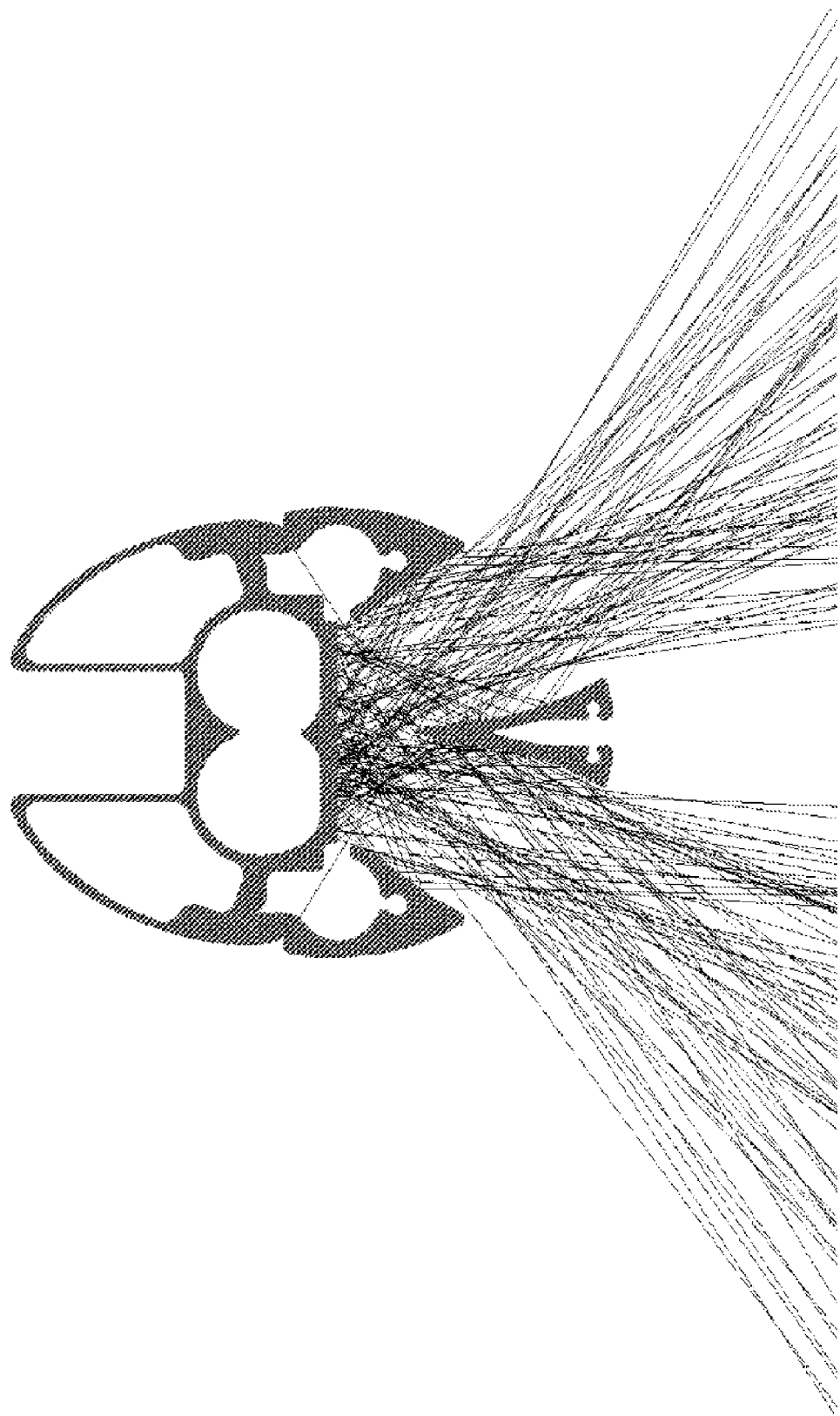
FIG. 21A is a cross section close up, at the receiver, of the concentration pattern of real incoming solar rays with imperfect specular reflection, when the trough is 0.075 degrees off center i.e. during solar tracking, i.e. the same as FIG. 21 but with non-idealized rays and imperfect reflection.

Further, this method includes maintaining generally even distribution of concentrated light over the surface of the encapsulated PV array 60 while tracking the sun, i.e. changes in relative position of the sun with regard to perfect alignment with the trough. FIG. 21 shows concentration pattern of idealize parallel rays and perfect specular reflection from the main mirror 11, with a shifted alignment, specifically in the solar tracking position of 0.1 degrees off center. FIG. 21A is the same as FIG. 21 but the solar rays are non-parallel and with imperfect specular reflection from the main mirror 11.

Figure 22:
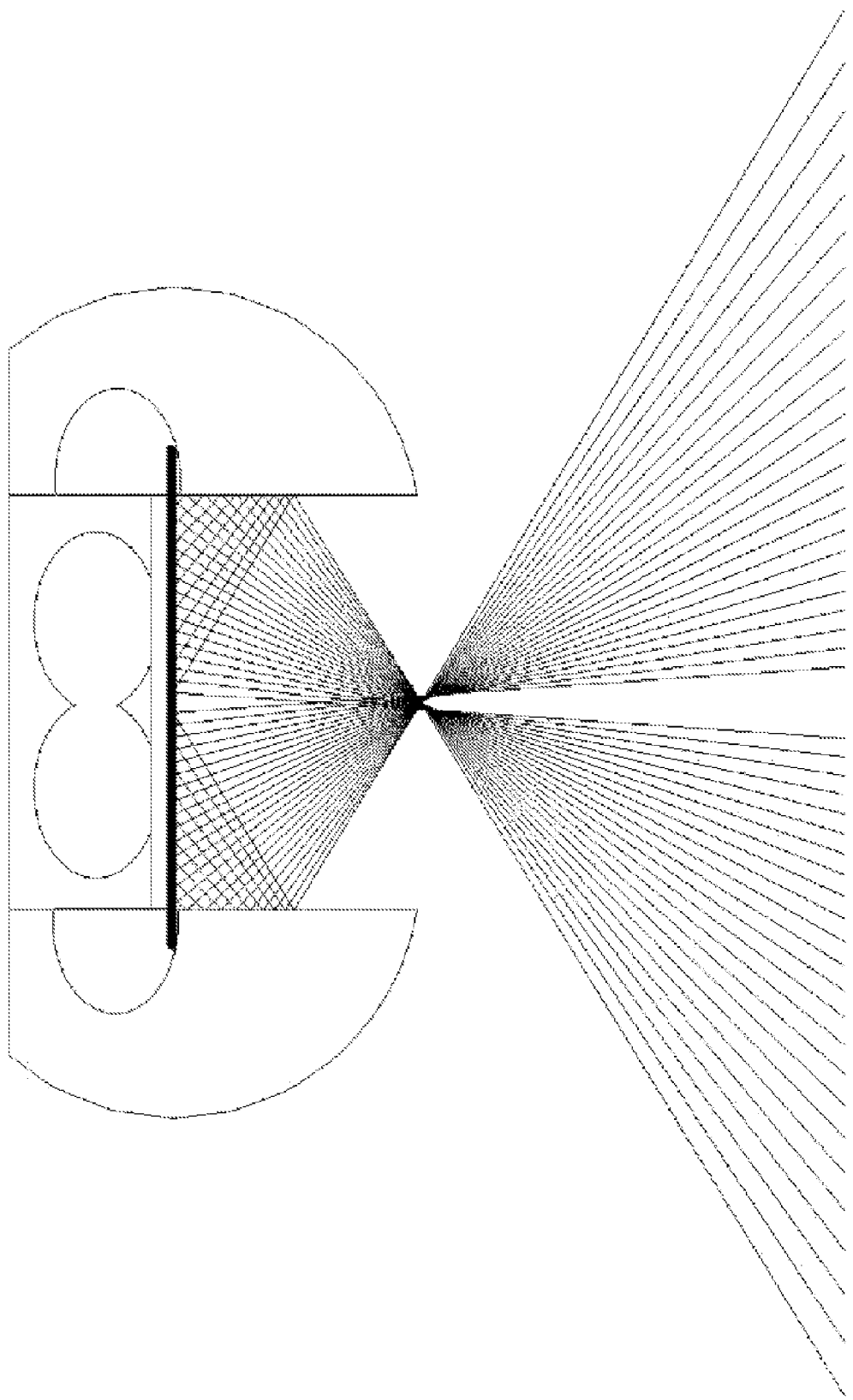
FIG. 22 is a cross section view of an alternative method of distributing and maintaining even distribution of concentrated light over the cell(s) using a single focal point pattern, the side mirror faces are perpendicular to the cell face.

This invention includes alternative method of distributing and maintaining distribution of concentrated light over the cell(s) as shown in FIG. 22, an alternative concentration pattern neutral position, whereby a higher percent of light is reflected from the sidewalls also achieving a generally even distribution pattern. This alternative has a more classic focal pattern with a single focal point where concentrated rays from the left and right halves cross. Rays crossing at a central point is both an advantage and disadvantage of this focusing method. This can be advantageous because it is a simpler pattern to produce and may be beneficial for thermal concentrators, which may benefit from a tight focus or require light to pass through a narrow aperture or smaller receiver tube. It also allows for greater acceptance angles while providing a generally even light distribution. The disadvantage is for CPV applications the central crossing of the rays can create a long shadow from supports, wires and hoses, (depending on sun angle), for a significant portion of the year. This shadow is highly disadvantageous for PV arrays, shadowing can severely limit or block output from an entire array. Bypass diodes can be used to address this problem somewhat but the net array output will be significantly lower. In this alternative, side mirrors are generally perpendicular to the cell face and receives a generally greater proportion of the concentrated rays on first impact.

Figure 24:
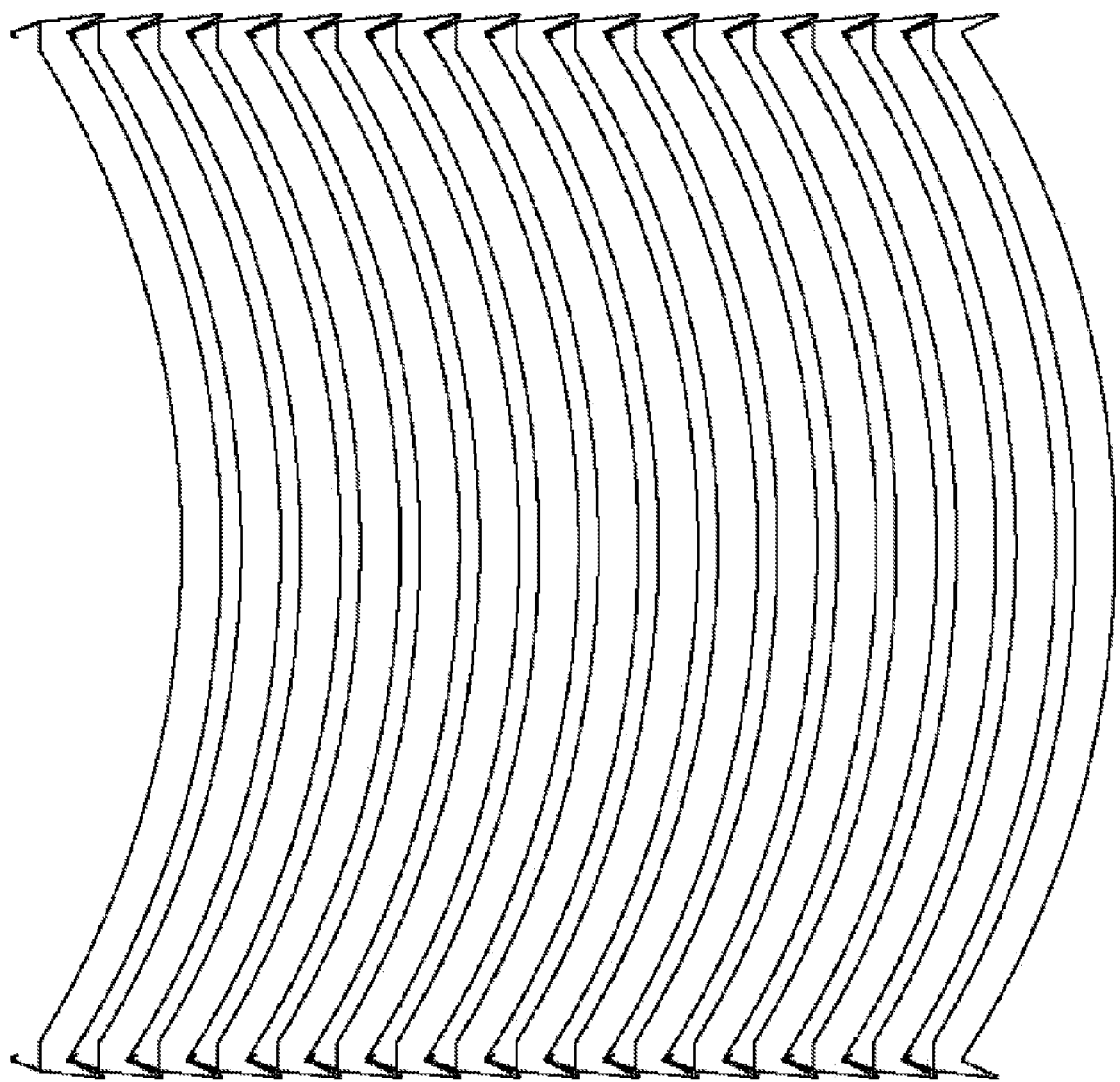
FIG. 24 is a plan view of a nested stack of troughs for shipping.

For shipping efficiency, improved parabolic troughs of this invention are designed to be nested with a minimum of spacing to improve the efficiency of packaging multiple units, as illustrated in FIG. 24. It is intended that troughs be shipped standing vertically, resting on one of the longitudinal ends by means of either a standard ISO container or box trailer. Efficient shipping allows trough units to be factory assembled with minimum field assembly required. Further, due to the reduced mass of a unibody construction and tight packing, shipping cost will be reduced.

Since other modifications and changes varied to fit particular operating requirements, and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

I claim:

1. An apparatus, comprising:
    a single-body parabolic trough concentrator having a mirrored surface;
    two receiver supports located at each end of the single-body parabolic trough concentrator; and
    a receiver connected to the two receiver supports such that the receiver is positioned centrally and above the single-body parabolic trough concentrator, the receiver comprising:
        one or more receiver fluid channels, extending internally along a length of the receiver;
        a solar alignment channel which extends along a length of the receiver and is disposed on a sun-facing side of the receiver;
        two side mirrors disposed below the one or more receiver fluid channels, each side mirror disposed opposite the other side mirror and configured to re-direct impacting light rays from a portion of the mirrored surface to a photovoltaic array disposed on an underside of the on or more receiver fluid channels; and
        an apex mirror disposed below the one or more receiver fluid channels and disposed between the one or more receiver fluid channels and the mirrored surface,
        the apex mirror having a triangular shape formed by two mirrored sides that converge to physically contact at a first end and having an opening at a second end opposite to the first end, wherein the first end is between the two side mirrors, and the second end is below the two side mirrors,
        wherein the apex mirror is configured to re-direct the impacting light rays directed from a portion of the mirrored surface to the photovoltaic array on the underside of the one or more receiver fluid channels to disperse the impacting light rays over a surface of the photovoltaic array; and
    wherein the single-body parabolic trough concentrator is configured to have a dual-focus arrangement.

2. The apparatus of claim 1, the single-body parabolic trough concentrator further comprising:
    a back shell sheet stretched across a plurality of back shell ribs, wherein the mirrored surface is disposed on a front face of the back shell sheet; and
    a side rail disposed on each longitudinal edge of the single-body parabolic trough concentrator such that each side rail caps the back shell sheet and the plurality of back shell ribs.

3. The apparatus of claim 2, the single-body parabolic trough concentrator further comprising a radiator including a plurality of radiator tubes, a first radiator plenum, and a second radiator plenum, where the first and second radiator plenums are disposed along opposite curved ends of the single-body parabolic trough concentrator, wherein a heat transfer fluid from the one or more receiver fluid channels is passed to the first radiator plenum, which supplies the heat transfer fluid to the radiator tubes, where the heat transfer fluid is then collected b the second radiator plenum.

4. The apparatus of claim 1, the receiver further comprising:
    an electrical wire channel;
    wherein the two side mirrors are disposed below the photovoltaic array and configured to hide one or more photovoltaic array bus bars.

5. The apparatus of claim 1, wherein the one or more receiver fluid channels comprise an internal flow mixer to swirl and mix fluid as the fluid moves along the length of the one or more receiver fluid channels.

6. The apparatus of claim 1, wherein the single-body parabolic trough concentrator is configured to provide nesting of a plurality of single-body parabolic trough concentrators with minimum spacing.

7. The apparatus of claim 1, wherein the mirrored surface is configured to provide a dual focus such that the dual focus interacts with the two side mirrors and apex mirror to provide an even distribution of solar rays.

8. The apparatus of claim 1, wherein the two receiver supports are fluid channels to convey a fluid to the receiver as well as provide structural support to the apparatus.

9. The apparatus of claim 1, the single-body parabolic trough concentrator further comprising:
    an aerodynamic spoiler disposed on a rim of each longitudinal edge of the single-body parabolic trough concentrator; and an anti-lift aero balance tube comprising a circular tube extending along a length of the single-body parabolic trough concentrator;

wherein the anti-lift aero balance tube is mounted to the single-body parabolic trough concentrator using one or more tube mounts disposed on the underside of the single-body parabolic trough concentrator.

10. The apparatus of claim 9, the aerodynamic spoiler comprising:

a lower lip of the aerodynamic spoiler forming a protrusion extending downwardly from the underside of the single-body parabolic trough concentrator; and an upper lip extending above the rim of the longitudinal edge.

11. The apparatus of claim 10, wherein the upper lip comprises a washing tube disposed within a groove formed by a bend along an edge of the upper lip, the washing tube having a plurality of holes spaced along a length of the washing tube.

12. The apparatus of claim 11, wherein the washing tube is disposed only on one longitudinal edge of the single-body parabolic trough concentrator.

13. The apparatus of claim 10, wherein the aerodynamic spoiler is comprised of steel, aluminum, or a composite material.

14. The apparatus of claim 9, wherein the anti-lift aero balance tube is comprised of steel, aluminum, a composite material, or other metal.

15. The apparatus of claim 9, wherein the anti-lift aero balance tube is comprised of plastic.

16. The apparatus of claim 9, wherein cooling lines are disposed inside or on the outside of the anti-lift aero balance tube.

* * * * *